(12) United States Patent
Wang et al.

(10) Patent No.: US 11,521,905 B2
(45) Date of Patent: Dec. 6, 2022

(54) PACKAGE STRUCTURE AND METHOD OF MANUFACTURING THE SAME

(71) Applicant: Taiwan Semiconductor Manufacturing Company, Ltd., Hsinchu (TW)

(72) Inventors: Pu Wang, Hsinchu (TW); Li-Hui Cheng, New Taipei (TW); Szu-Wei Lu, Hsinchu (TW); Tsung-Fu Tsai, Changhua County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 83 days.

(21) Appl. No.: 17/075,703

(22) Filed: Oct. 21, 2020

(65) Prior Publication Data
US 2022/0122896 A1 Apr. 21, 2022

(51) Int. Cl.
| | |
|---|---|
| *H01L 23/18* | (2006.01) |
| *H01L 25/10* | (2006.01) |
| *H01L 25/18* | (2006.01) |
| *H01L 23/00* | (2006.01) |
| *H01L 23/31* | (2006.01) |
| *H01L 25/00* | (2006.01) |
| *H01L 23/367* | (2006.01) |
| *H01L 23/29* | (2006.01) |

(52) U.S. Cl.
CPC .......... *H01L 23/18* (2013.01); *H01L 23/3185* (2013.01); *H01L 23/3675* (2013.01); *H01L 24/73* (2013.01); *H01L 25/105* (2013.01); *H01L 25/18* (2013.01); *H01L 25/50* (2013.01); *H01L 23/295* (2013.01); *H01L 2224/73204* (2013.01)

(58) Field of Classification Search
CPC ........................... H01L 23/18; H01L 23/3185
See application file for complete search history.

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |

(Continued)

*Primary Examiner* — Errol V Fernandes
(74) *Attorney, Agent, or Firm* — JCIPRNET

(57) ABSTRACT

A package structure includes a package substrate, a first semiconductor package and a second semiconductor package, an underfill material, a gap filling structure and a heat dissipation structure. The first semiconductor package and the second semiconductor package are electrically bonded to the package substrate. The underfill material is disposed to fill a first space between the first semiconductor package and the package substrate and a second space between the second semiconductor package and the package substrate. The gap filling structure is disposed over the package substrate and in a first gap laterally between the first semiconductor package and the second semiconductor package. The heat dissipation structure is disposed on the package substrate and attached to the first semiconductor package and the second semiconductor package through a thermal conductive layer.

20 Claims, 22 Drawing Sheets

1000B

(56) References Cited

U.S. PATENT DOCUMENTS

| | | |
|---|---|---|
| 9,666,502 B2 | 5/2017 | Chen et al. |
| 9,735,131 B2 | 8/2017 | Su et al. |
| 2019/0348340 A1* | 11/2019 | Kwon .................... H01L 23/10 |
| 2019/0348343 A1* | 11/2019 | Kwon ................... H01L 23/367 |

* cited by examiner

PACKAGE STRUCTURE AND METHOD OF MANUFACTURING THE SAME

BACKGROUND

The semiconductor industry has experienced rapid growth due to continuous improvements in the integration density of various electronic components (i.e., transistors, diodes, resistors, capacitors, etc.). For the most part, this improvement in integration density has come from continuous reductions in minimum feature size, which allows more of the smaller components to be integrated into a given area. These smaller electronic components also demand smaller packages that utilize less area than previous packages. Some smaller types of packages for semiconductor components include quad flat packages (QFPs), pin grid array (PGA) packages, ball grid array (BGA) packages, flip chips (FC), three-dimensional integrated circuits (3DICs), wafer level packages (WLPs), and package on package (PoP) devices and so on.

Currently, Chip-On-Wafer-On-Substrate (CoWoS) packaging technology facilitating power-efficient and high-speed computing has been developed. However, there still are quite a few challenges to be handled for the technology of CoWoS package.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
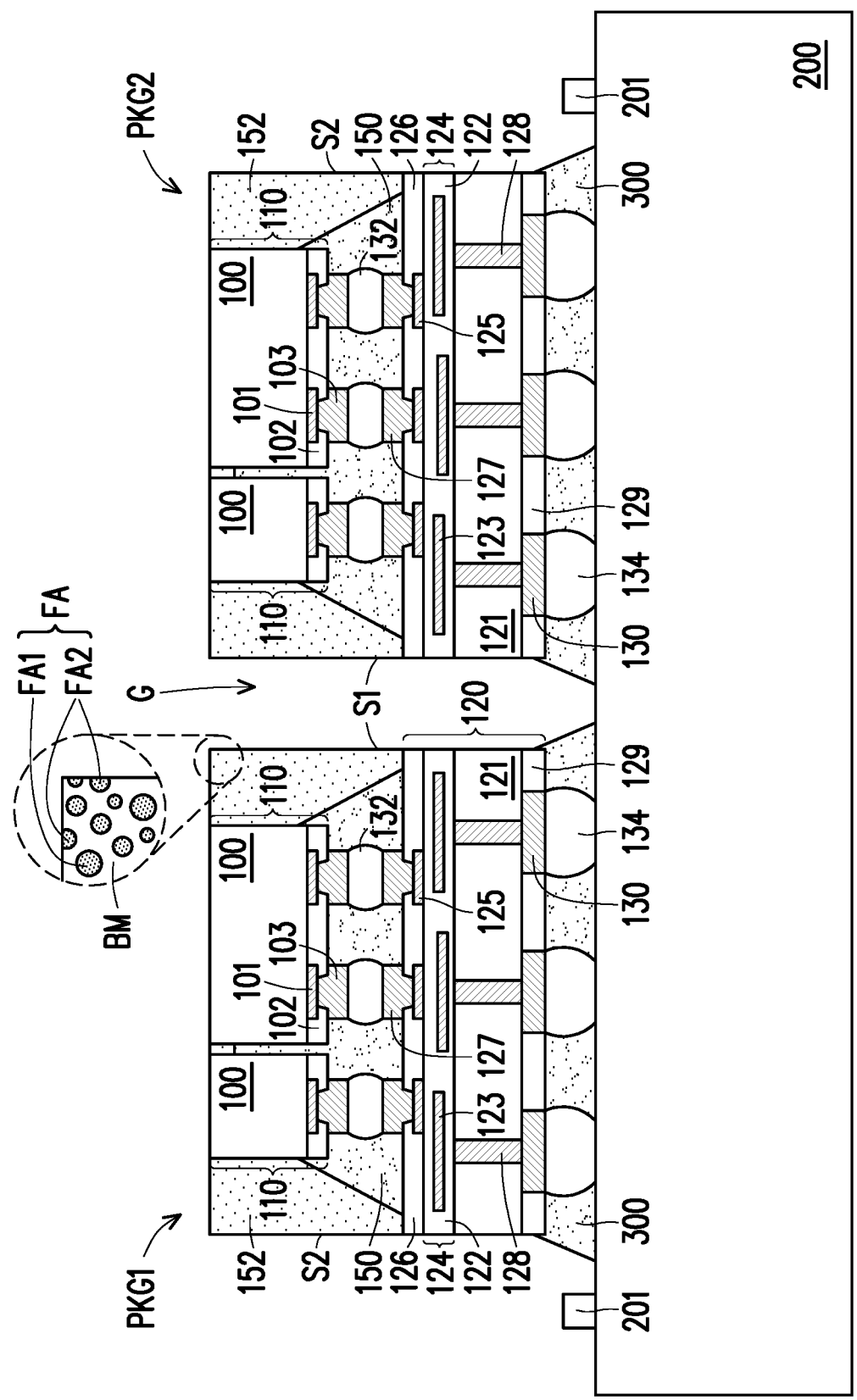
FIG. 1A to FIG. 1D are cross-sectional views illustrating a method of forming a package structure according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "above", "upper" and the like, may be used herein for ease of description to describe one element or feature's relationship to another element(s) or feature(s) as illustrated in the FIGS. The spatially relative terms are intended to encompass different orientations of the device in use or operation in addition to the orientation depicted in the FIGS. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1D are cross-sectional views illustrating a method of forming a package structure according to some embodiments of the disclosure.

Referring to FIG. 1, in some embodiments, a plurality of semiconductor packages are provided and bonded to a package substrate 200. The plurality of semiconductor packages may have been singulated before bonding to the package substrate 200. For example, the semiconductor packages include a semiconductor package PKG1 and a semiconductor package PKG2 which are disposed side by side on the package substrate 200 and laterally spaced apart from each other. It is noted that, the number of the semiconductor packages bonded to the package substrate 200 shown in the figures is merely for illustration, and the disclosure is not limited thereto. Any suitable number of semiconductor packages may be mounted to the package substrate 200, and each of the semiconductor packages may be any suitable type of packages depending on product design and requirement. In some embodiments, the plurality of semiconductor packages may include chip-on-wafer packages, three-dimensional integrated circuits, integrated fan-out packages, system on integrated chips, or the like, or other suitable type of semiconductor packages, or combinations thereof. The plurality of semiconductor packages may be the same types of packages or different types of packages.

In some illustrative embodiments, the semiconductor packages PKG1 and PKG2 are chip-on-wafer packages and have similar structures. The sizes (e.g., width, height, etc.) of the semiconductor packages PKG1 and PKG2 may be the same or different. For example, the heights of the semiconductor packages PKG1 and PKG2 may be the same or different. In some embodiments, the semiconductor package PKG1 or PKG2 includes one or more dies 110, an interposer 120, an underfill layer 150, an encapsulant 152, and a plurality of connectors 134.

In some embodiments, the dies 110 may be electrically connected to the interposer 120 in a flip-chip manner. The dies 110 may be singulated from a same wafer or different wafers, and may be the same types of dies or different types of dies. For example, the dies 110 may respectively be an application-specific integrated circuit (ASIC) chip, a system on chip (SoC), an analog chip, a sensor chip, a wireless and radio frequency chip, a voltage regulator chip, a memory chip, a high bandwidth memory (HBM) chip or the like. In some embodiments, one of the dies 110 is a system on chip, while the other one of the dies 110 is a HBM chip. The HBM chip includes a plurality of dies stacked on one another and electrically connected to each other, and each of the dies may have structures similar to those described herein with respect to the die 110. However, the disclosure is not limited thereto. Any combination of suitable types of dies may be applied in the semiconductor package. Further, the number of the dies 110 included in the semiconductor package PKG1 or PKG2 shown in the figures is merely for illustration, and the disclosure is not limited thereto.

In some embodiments, the dies 110 may have similar structures, and the sizes of the dies 110 may be the same or different. For example, the die 110 includes a substrate 100, a plurality of pads 101, a passivation layer 102, and a plurality of connectors 103. In some embodiments, the substrate 100 is a semiconductor substrate made of silicon and/or other semiconductor materials. Alternatively or additionally, the substrate 100 includes other elementary semiconductor materials such as germanium, gallium arsenic, or other suitable semiconductor materials. In some embodiments, the substrate 100 may further include other features such as various doped regions, a buried layer, and/or an epitaxy layer. Moreover, in some embodiments, the substrate 100 is made of an alloy semiconductor such as silicon germanium, silicon germanium carbide, gallium arsenic phosphide, or gallium indium phosphide. Furthermore, the substrate 100 may be a semiconductor on insulator (SOI) such as silicon on insulator or silicon on sapphire.

In some embodiments, the substrate 100 has a plurality of devices (e.g., integrated circuit devices) formed therein and/or thereon. In some embodiments, the devices may be active devices, passive devices, or combinations thereof. The devices are, for example, transistors, capacitors, resistors, diodes, photodiodes, fuse devices, or the like, or combinations thereof.

In some embodiments, an interconnection structure (not shown) is formed over the devices of the substrate 100. The interconnection structure includes a metallization structure formed in a dielectric structure. The metallization structure electrically connects the different devices in and/or on the substrate 100, so as to form a functional circuit. In some embodiments, the dielectric structure includes an inter-layer dielectric layer (ILD) and one or more inter-metal dielectric layers (IMD). In some embodiments, the metallization structure includes multiple layers of conductive lines and plugs (not shown). The conductive lines and plugs include conductive materials, such as metal, metal alloy or a combination thereof. For example, the conductive material may include tungsten (W), copper (Cu), copper alloys, aluminum (Al), aluminum alloys, or combinations thereof. The plugs include contact plugs and via plugs. The contact plugs are disposed in the ILD to be connected to the metal lines and the devices. The via plugs are disposed in the IMD to connect the metal lines in different layers.

The pads 101 may be or electrically connected to a top conductive feature of the interconnection structure, and further electrically connected to the devices formed on the substrate 100 through the interconnection structure. The pads 101 include conductive materials, which may include metal or metal alloy, such as aluminum, copper, nickel, or alloys thereof. In an embodiment, the pads 101 are aluminum pads, but the disclosure is not limited thereto.

The passivation layer 102 is formed over the substrate 100 and partially covers the pads 101. The material of the passivation layer 102 may include silicon oxide, silicon nitride, silicon oxynitride, or a combination thereof. Additionally or alternatively, the passivation layer 102 may include a polymer material such as photosensitive polybenzoxazole (PBO), polyimide (PI), benzocyclobutene (BCB), a combination thereof, and/or the like. Portions of the pads 101 are exposed by the passivation layer 102 for further electrical connection. The conductive connectors 103 are formed on and electrically connected to the pads 101 exposed by the passivation layer 102. The connectors 103 may include solder bumps, gold bumps, copper bumps, copper posts, copper pillars, or the like. In some embodiments, the connector 103 includes a seed layer and a conductive pillar on the seed layer (not specifically shown). The seed layer may be a metal seed layer such as a copper seed layer. In some embodiments, the seed layer includes a first metal layer such as a titanium layer and a second metal layer such as a copper layer over the first metal layer. The conductive pillar may include copper, nickel and/or other suitable metals. In some embodiments, a structure of the conductive pillar includes copper, copper/nickel, or copper/nickel/copper. In other words, the conductive pillar may include a copper post, and a nickel layer may be disposed on the top of the copper post, or embedded in the copper post at a position near the top surface of the copper post.

In some embodiments, the die 110 further includes an additional passivation layer (not shown) disposed on the passivation layer 102 and laterally surrounding the connectors 103. The additional passivation layer may include a material the same as or different from that of the passivation layer 102. In some embodiment, the surface of the die 110 including and/or close to the connectors 103 may be referred to as a front surface (or an active surface) of the die 110, while the surface opposite to the front surface of die 110 (i.e., a surface of the substrate 100) may be referred to as a back surface of the die 110.

In some embodiments, the dies 110 are flipped upside down and electrically mounted on the interposer 120. In other words, the dies 110 are mounted to the interposer 120 with the front surfaces thereof facing the interposer 120. The dies 110 may be electrically bonded to the interposer 120 through a plurality of conductive connectors 132. The conductive connectors 132 may include solder bumps, silver balls, copper balls, or any other suitable metallic balls/bumps. In some embodiments, the conductive connectors 132 are micro bumps. In some embodiments, the conductive connectors 132 are disposed between the connectors 103 of the dies 110 and the connectors 127 of the interposer 120 to provide the electrical connection therebetween.

In some embodiments, the interposer 120 may be singulated from a wafer interposer (or called initial interposer). For example, the interposer 120 may include a substrate 121, an interconnection structure 124, a plurality of conductive pads 125, a passivation layer 126, a plurality of connectors 127, conductive vias 128, a dielectric layer 129, and conductive patterns 130.

In some embodiments, the substrate 121 is a semiconductor substrate, and the material of the substrate 121 is similar to, and may be the same as or different from those of the substrate 100 of the die 110. For example, the substrate 121 is a silicon substrate. In some embodiments, the substrate 121 is a blank silicon substrate, and is free of devices formed therein and/or thereon, but the disclosure is not limited thereto. In alternative embodiments, the substrate 121 may also include devices (e.g., active and/or passive devices) formed therein and/or thereon.

The interconnection structure 124 is disposed on the front side of the substrate 121 and may include a structure similar to that of the interconnection structure of the die 110. For example, the interconnection structure 124 includes a dielectric structure 122 and a plurality of conductive features 123. The conductive features 123 may be embedded in the dielectric structure 122 and may include multi-layers of conductive lines and conductive vias (not shown) stacked alternately; the conductive vias may be disposed vertically between the conductive lines so as to electrically connect the conductive lines in different layers. The materials of the conductive features 123 and the dielectric structure 122 may be selected from the same candidate materials of the metallization structure and the dielectric structure of the interconnection structure of the die 110, which are not described again here.

The conductive pads 125 may be or electrically connected to a top conductive feature of the interconnection structure 124. The passivation layer 126 partially covers the conductive pads 125. The connectors 127 are disposed on the conductive pads 125 exposed by the passivation layer 126 and electrically connected to the conductive pads 125. The materials of the conductive pads 125, the passivation layer 126 and the connectors 127 may be selected from the same candidate materials of the pads 101, the passivation layer 102 and the connectors 103, respectively.

The conductive vias 128 are embedded in the substrate 121 and are electrically connected to the interconnect structure 124. In some embodiments, the conductive vias 128 penetrate through the substrate 121 and may also be referred to as through substrate vias (TSVs). In some embodiments, dielectric liners (not shown) are disposed between the conductive vias 128 and the substrate 102 to separate the conductive vias 128 from the substrate 121. For example, the dielectric liners may surround the sidewalls of the conductive vias 128 and sandwiched between the conductive vias 128 and the substrate 121, respectively. The conductive vias 128 may include copper, copper alloys, aluminum, aluminum alloys, Ta, TaN, Ti, TiN, CoW or combinations thereof. The dielectric liner include dielectric material, such as silicon oxide, silicon nitride, silicon oxynitride or the like, or combinations thereof. The conductive vias 128 may extend into the interconnect structure 124 to be in physical and electrical contact with the conductive features 123 of the interconnect structure 124. In some embodiments, the conductive vias 128 extend through the substrate and are revealed at the back surface of the substrate 121.

In some embodiments, the interposer 120 includes one or more dielectric layer 129 disposed on back side of the substrate 121, and one or more tiers of conductive patterns 130 are formed in the one or more dielectric layer 129 to electrically connect to the conductive vias 128. The dielectric layer 129 may include silicon oxide, silicon nitride, silicon carbide, silicon oxynitride, low-K dielectric material, such as PSG, BPSG, FSG, SiOxCy, Spin-On-Glass, Spin-On-Polymers, silicon carbon material, compounds thereof, composites thereof, combinations thereof, or the like. Alternatively or additionally, the dielectric layer 129 may include a polymer material, such as PBO, PI such as low temperature (LTPI), BCB, a combination thereof or the like. The conductive patterns 130 may include metal such as copper, nickel, titanium, aluminum, tungsten, silver, combinations thereof or the like. In some embodiments, the conductive patterns 130 are used to electrically connect the conductive vias 128 together and/or electrically connect the conductive vias 128 to external components or devices. The conductive patterns 130 may include conductive vias and/or traces electrically connected to the conductive vias 128. In some embodiments, the conductive patterns 130 may also be referred to as redistribution layers.

It is noted that, the interposer 120 described and shown herein is merely for illustration, and the disclosure is not limited thereto. Other suitable types of interposer providing electrical connection between the dies 100 and the package substrate 200 may also be applied in the disclosure and are within the scope of the present disclosure. For example, an organic interposer may be used. The organic interposer may include a plurality of polymer layers and a plurality of redistribution layers (RDLs) formed in and/or on the polymer layers. The polymer layers include polymer materials such as PI, PBO, BCB, or the like, or combinations thereof. The redistribution layers include multi-layers of conductive vias and conductive traces electrically connected to each other. The redistribution layers provide electrical connection between the dies 110 and the package substrate 200. The organic interposer may also be referred to as an RDL interposer.

Still referring to FIG. 1A, in some embodiments, underfill layer(s) 150 is/are disposed to fill the spaces between the dies 110 and the interposer 120. The underfill layer 150 may include a polymer material, such as resin. The underfill layer 150 may further include a plurality of small fillers distributed in the polymer material or free of filler. The filler may include silicon oxide, aluminum oxide, boron nitride, alumina, silica, or the like, or combinations thereof, for example. In some embodiments, the underfill layer 150 laterally surrounds the connectors 103 of the dies 110, the connectors 127 of the interposer 120 and the conductive connectors 132. The underfill layer 150 may partially cover the top surface of the interposer 120, and may partially or completely cover the bottom surfaces (i.e., front surfaces) of the dies 110. In some embodiments, the underfill layer 150 may further extend to partially cover sidewalls of the dies 110. In other words, the bottom corners of the dies 110 may be covered by the underfill layer 150.

In some embodiments, as shown in FIG. 1A, the underfill layer 150 between different dies 110 and the interposer 120 may be merged together and may further extend to fill the gap between the adjacent dies 110. In other words, the underfill layer 150 is a continuous layer extending from a space between the one of the dies 110 and the interposer 120 to a space between the other one of the dies 110 and the interposer 120. However, the disclosure is not limited thereto. In alternative embodiments, a plurality of underfill layers 150 may be formed to separately fill the spaces between the dies 110 and the interposer 120 without being merged together.

The encapsulant 152 may be disposed on the interposer 120 to encapsulate the dies 120 and/or the underfill layers 150. In some embodiments, the encapsulant 152 includes a molding compound, a molding underfill, a resin such as epoxy, a combination thereof, or the like. In some other embodiments, the encapsulant 152 includes a photo-sensitive material such as polybenzoxazole (PBO), polyimide (PI), benzocyclobutene (BCB), a combination thereof, or the like. In alternative embodiments, the encapsulant 152 includes nitride such as silicon nitride, oxide such as silicon oxide, phosphosilicate glass (PSG), borosilicate glass (BSG), boron-doped phosphosilicate glass (BPSG), a combination thereof, or the like.

In some embodiments, the encapsulant 152 includes a molding compound which is a composite material including a base material (such as polymer) BM and a plurality of fillers FA distributed in the base material BM. The fillers FA may be a single element, a compound such as nitride, oxide, or a combination thereof. The fillers FA may include silicon oxide, aluminum oxide, boron nitride, alumina, silica, or the like, for example. In some embodiments, the fillers FA are spherical particles, or the like. The cross-section shape of the fillers FA may be circle, oval, or any other suitable shape. In some embodiments, the fillers FA include solid fillers, hollow fillers, or a combination thereof. In some embodiments in which both of the underfill layer 150 and the encapsulant 152 include fillers, the materials of the fillers included in the underfill layer 150 and the fillers included in the encapsulant 152 may be the same or different, while the filler content and/or filler size of the underfill layer 150 and the encapsulant 152 may be different. For example, the filler size of the underfill layer 150 may be less than the filler size of the encapsulant 152.

In some embodiments, during the fabrication of the semiconductor package PKG1/PKG2, the top surface of the encapsulant 152 may be subjected to a planarization process, such as chemical mechanical polishing (CMP), and the sidewall of the encapsulant 152 may be subjected to a singulation process, such as mechanical saw, laser dicing, or the like, or combinations thereof. In some embodiments, due to these fabrication processes, some of the fillers FA (e.g., fillers FA2) at the top of encapsulant 152 may be cut and partially removed by the planarization process, and some of the fillers FA (e.g., fillers FA2) at the sidewall of the encapsulant 152 may be cut and partially removed by the singulation process. As a result, the fillers FA may include fillers FA1 and FA2 distributed in the base material BM. The fillers FA1 are farther from the sidewalls and top surface of the base material BM. The fillers FA2 are distributed at top surface and/or sidewalls of the base material BM.

Figure 1B:
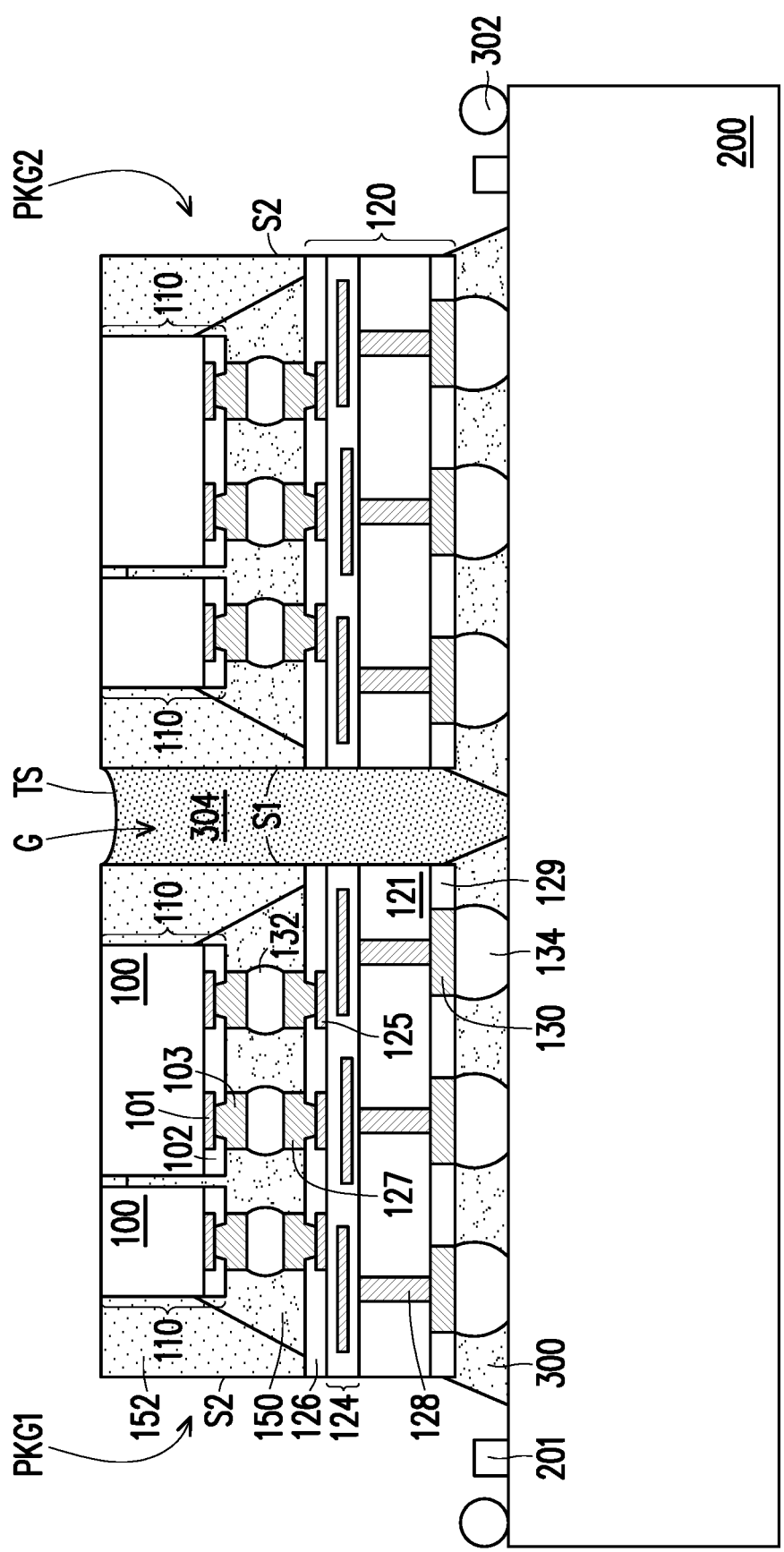

In some embodiments, the surface of the filler FA1 is rounded or curved; while a portion of the surface of the filler FA2 is rounded, and another portion of the surface of the filler FA2 is substantially flat due to the above-described fabrication process. The flat surfaces of the fillers FA2 and the surface of the base material BM constitute the top/side surface of the encapsulant 152. In some embodiments, the substantially flat surface of the fillers FA2 may be exposed at the top surface and/or sidewall of the encapsulant 152 at the stage of FIG. 1A. In some embodiments, the substantially flat surface of the filler FA2 exposed at the top surface of the encapsulant 152 may be in contact with a subsequently formed thermal conductive layer 306 (FIG. 1C), and the substantially flat surface of the filler FA2 exposed at the sidewall S1 of the encapsulant 152 may be covered by and in contact with a subsequently formed gap filling structure 304 (FIG. 1B). However, the disclosure is not limited thereto. In some other embodiments, there may have no fillers being cut/partially removed by the planarization process and/or the singulation process, and all of the fillers in the encapsulant 152 may be complete and have rounded surface.

In some embodiments, the encapsulant 152 encapsulate sidewalls of dies 110 and sidewalls of the underfill layer 150, and may fill the gap between the dies 110 that are not filled by the underfill layer 150. The top surface of the encapsulant 152 may be substantially coplanar with the top surfaces (e.g., back surfaces) of the dies 110. In some other embodiments, the encapsulant 152 may further encapsulate top surfaces of the dies 110 and thus have a top surface higher than the top surfaces of the dies 110. The sidewalls of the encapsulant 152 may be substantially aligned with sidewalls of the interposer 120.

Still referring to FIG. 1A, in some embodiments, a plurality of connectors 134 are disposed on and electrically connected to the conductive patterns 130 of the interposer 120. The connectors 134 may be solder balls, controlled collapse chip connection (C4) bumps, or the like. In some embodiments, the material of the connector 134 includes copper, aluminum, lead-free alloys (e.g., gold, tin, silver, aluminum, or copper alloys) or lead alloys (e.g., lead-tin alloys). The connectors 134 are electrically connected to the interposer 120 and further electrically coupled to the dies 110 through the interposer 120.

In some embodiments, the formation of the semiconductor package PKG1/PKG2 may include the following processes: electrically bonding the dies 110 to a wafer interposer; forming an underfill layer 150 to fill the spaces between the dies 110 and the wafer interposer; forming an encapsulant material on the wafer interposer to encapsulate the dies 110 and the underfill layer 150, the encapsulant material may be formed by a molding process followed by a planarization process such as a CMP process; forming dielectric material and conductive patterns on backside of the substrate 121 of the wafer interposer; forming connectors 134 on the conductive patterns; and performing a singulation process to singulate the semiconductor packages. The singulation process cut through the encapsulant material and the wafer interposer, so as to separate the semiconductor packages.

In some embodiments, the semiconductor packages PKG1 and PKG2 are arranged as side by side on the package substrate 200 and spaced apart from each other, and a gap G is existed between the semiconductor packages PKG1 and PKG2. The gap G may have a width larger than 3 mm, for example, but the disclosure is not limited thereto. The gap G may have any suitable width depending on product design and requirement.

In some embodiments, the semiconductor packages PKG1 and PKG2 are electrically bonded to the package substrate 200 through the connectors 134. The package substrate 200 may be a build-up substrate including a core therein and various conductive features, a laminate substrate including a plurality of laminated dielectric films and conductive features formed in the dielectric films. In some embodiments, the package substrate 200 may be a circuit substrate, such as a printed circuit board (PCB). In some embodiments, the package substrate 200 includes a plurality of conductive pads (not shown) disposed on top surface thereof, and the connectors 134 are electrically connected to the conductive pads.

In some embodiments, the package substrate 200 includes one or more passive devices 201 disposed on top surface the substrate 201 and laterally aside the semiconductor packages PKG1 and PKG2. The passive devices 201 may be integrated passive device (IPD), integrated voltage regulator (IVR), or the like, or combinations thereof. Alternatively or additionally, the passive devices 201 may include resistors, capacitors, inductors or the like, or combinations thereof. The passive devices 201 may be electrically connected to the package substrate 200, and the connect components (e.g., connectors, conductive pads, adhesive layers, or the like) between the passive devices 201 and the package substrate 200 are omitted for the sake of clarity and brevity. It is noted that, the number, sizes and locations of the passive devices shown in the figures are merely for illustration, and the disclosure is not limited thereto. In some other embodiments, the package substrate 200 may also include passive devices disposed on bottom surface thereof.

Still referring to FIG. 1A, in some embodiments, after the semiconductor packages PKG1 and PKG2 are bonded to the package substrate 200, an underfill material 300 is formed to fill the spaces between the semiconductor packages PKG1/PKG2 and the package substrate 200. The underfill material 300 may be formed by a dispensing process followed by a curing process and may be formed of a material selected from the same candidate material of the underfill layer 132. The underfill material 300 may also be referred to as underfill layers.

The underfill material 300 laterally surrounds the connectors 134 and covers portions of the top surface of the package substrate 200, partially or completely cover the bottom surface of interposer 120 of the semiconductor packages PKG1 and PKG2. In some embodiments, the underfill material 300 may further extend to cover portions of sidewalls of the semiconductor packages PKG1 and PKG2 (e.g., portions of sidewalls of the interposers 120). In other words, the bottom corners of the interposers 120 may be covered by the underfill material 300. In some alternative embodiments, the underfill material may not cover sidewalls of the semiconductor packages.

In some embodiments, the underfill material 300 is a non-continuous layer including multiple underfill layers 300 respectively disposed between the semiconductor packages and the package substrate. That is to say, the underfill layer 300 between the semiconductor package PKG1 and the package substrate 200 is laterally spaced apart from the underfill layer 300 between the semiconductor package PKG2 and the package substrate 200. However, the disclosure is not limited thereto. In some other embodiments, the underfill layer 300 is a continuous layer (FIG. 3A) extending from a space between the semiconductor package PKG1 and the package substrate 200 to a space between the semiconductor package PKG2 and the package substrate 200.

Referring to FIG. 1B, an adhesive material 302 is applied onto the top surface of the package substrate 200. The adhesive material 302 is formed for adhering of a heat dissipation structure onto the package substrate 200. In some embodiments, the adhesive layer 302 may be formed as a continuous layer which may be ring-shaped, surrounding the semiconductor packages PKG1/PKG2 and the passive devices 300. However, the disclosure is not limited thereto. In some other embodiments, the adhesive materials 302 may include a plurality of discrete sections distributed on the substrate 302. Alternatively, the adhesive material 302 may be pre-formed on the heat dissipation structure before adhering the heat dissipation structure onto the package substrate 200. The adhesive material 302 may include any suitable adhesive, such as epoxy, die attach film (DAF), silver paste, or the like, or combinations thereof. In some embodiments, the adhesive material 302 is formed by a dispensing process, for example.

Still referring to FIG. 1B, a gap filling material 304 is formed to fill the gap G between the semiconductor packages PKG1 and PKG2 by a dispensing process, for example. The material of the gap filling material 304 is different from the materials of the underfill layers 150/300 and the encapsulant 152.

In some embodiments, the gap filling material 304 is formed of a material having suitable properties that are advantage for controlling or reducing warpage of the semiconductor packages or the resulted package structure as well as reducing stress applied on the package substrate 200. In some embodiments, the properties (e.g., modulus, CTE, glass transition temperature, etc.) of the gap filling material 304 are close to and may be different from those of the encapsulant 152 and the underfill material 150/300. In some embodiments, the modulus of the gap filling material 304 may be close to or less than the modulus of the encapsulant 152 and/or the modulus of the underfill material 150/300. For example, the gap filling material 304 may have a modulus of few Mpa, the modulus of the encapsulant 152 may be less than 1 GPa, while the modulus of the underfill material 150/300 may range from 1 to 10 GPa. The coefficient of thermal expansion (CTE) of the gap filling material 304 may be close to the CTEs of the encapsulant 152 and the underfill material 150/300. For example, the CTE of the gap filling material 304 may range from 50 ppm to 250 ppm, the CTE of the encapsulant 152 may range from 100 ppm to 200 ppm, and the CTE of the underfill material 150/300 may be less than 100 ppm. In addition, the glass transition temperature (Tg) of the gap filing material 304 may be close to, less than, or larger than the glass transition temperature of the encapsulant 152 and/or the underfill layer 150/300. For example, the Tg of the gap filling material may range from 50° C. to 150° C., the Tg of the encapsulant 152 may be less than 100° C., and the Tg of the underfill material 150/300 may range from 100° C. to 150° C. In some embodiments, the elongation of the gap filling material 304 is less than 100%.

In some embodiments, the gap filling material 304 includes a polymeric material such as a gel. For example, the gap filling structure 304 may include adhesive, glue, gel or underfill like material, or combinations thereof. The gap filling structure 304 may include fillers therein or free of fillers. In some embodiments in which the gap filling structure 304 include fillers, one or more of the filler content, filler size and the filler material may be the same as or different from those of the underfill layers 132/134 and the encapsulant 152. The gap filling material 304 may also be referred to as a gap filling structure.

In some embodiments, the gap filling structure 304 lands on the package substrate 200 and laterally sandwiched between the semiconductor packages PKG1 and PKG2, and between the underfill layers 300. The sidewalls of the gap filling structure 304 are in contact with sidewalls of the semiconductor packages PKG1/PKG2 and the underfill layers 300. The bottom surface of the gap filling structure 304 covers and in contact with a portion of the top surface of the package substrate 200. The top surface TS of the gap filling structure 304 may be substantially coplanar with or lower than top surfaces of the semiconductor packages PKG1 and PKG2. In some embodiments, the gap filling structure 304 does not overfill the gap G and does not cover the top surfaces of the semiconductor packages PKG1 and PKG2, which is benefit for the subsequent process of applying thermal conductive layer onto the semiconductor packages.

In some embodiments, the top surface TS of the gap filling structure 304 is concavely recessed toward the package substrate 200. In other words, the gap filling structure 304 may include a recess defined by the top surface TS thereof. For example, the opposite ends of the top surface TS may be in contact with corresponding sidewalls (e.g., topmost point of the sidewalls) of the semiconductor packages PKG1/PKG2, and the top surface TS arcs between the opposite ends toward the package substrate 200. In some embodiments, the level height of the top surface TS relative to the top surface of the package substrate 200 gradually decreases as away from the sidewall of the semiconductor package PKG1 and then gradually increases as approaching the sidewall of the semiconductor package PKG2. For example, the level height of the top surface TS relative to the top surface of the package substrate 200 is gradually decreased from a first end contacting the sidewall of the semiconductor package PKG1 to a center point of the top surface TS and then gradually increased form the center point to the other end contacting the sidewall of semiconductor package PKG2. The center point of the top surface TS described herein refers to a point of the top surface TS that is spaced an equal lateral distance from the sidewall of the semiconductor package PKG1 and the sidewall of the semiconductor package PKG2.

In some embodiments, both of the adhesive material 302 and the gap filling structure 304 are formed by dispensing process, and may be formed in a same process tool. In some embodiments, the gap filling structure 304 and the adhesive material 302 may be dispensed by a same dispensing head or different dispensing heads in the process tool. The gap filling structure 304 may be formed after or before forming the adhesive material 302. In some embodiments, the gap filling structure 304 and the adhesive material 302 are not cured at this stage.

Figure 1C:
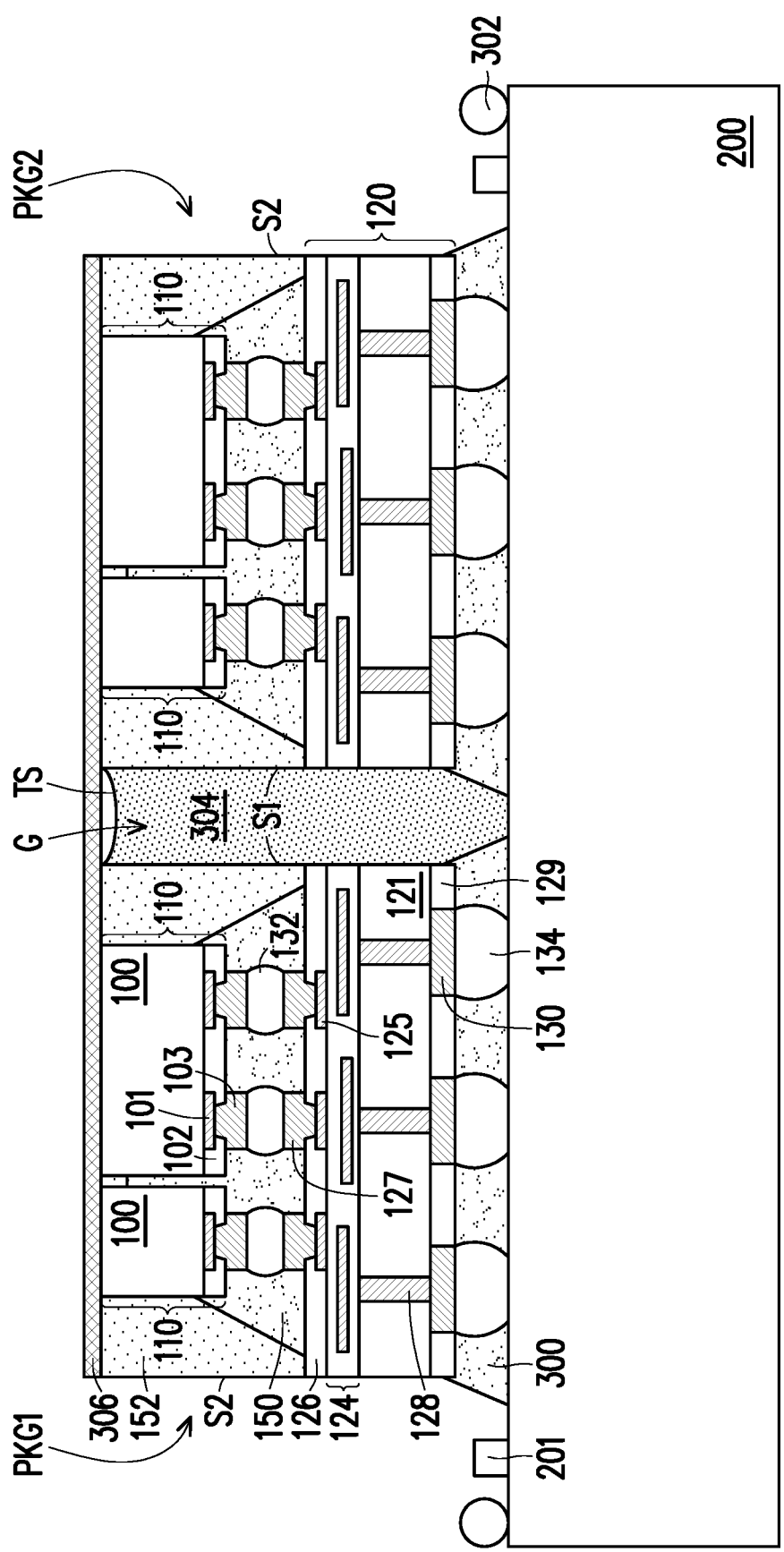

Referring to FIG. 1C, a thermal conductive layer 306 is formed over the semiconductor packages PKG1 and PKG2 and the gap filling structure 304. In some embodiments, the thermal conductive layer 306 includes a thermal interfacial material (TIM). For example, the thermal conductive layer 306 includes graphite or metal such as tin, silver, copper, indium, alloys thereof or the like, or combinations thereof. The thickness T1 of the thermal conductive layer 306 may range from 10 μm to 500 μm, for example. In some embodiments, the thermal conductive layer 306 is compressible.

The method of forming the thermal conductive layer 306 may include placing the thermal conductive layer 306 over the semiconductor packages PKG1/PKG2 and pressing the thermal conductive layer 306 onto the semiconductor packages PKG1/PKG2. The above steps may be performed by a pickup tool, a bonding head, an indenter, a roller or the like, or combinations thereof. In some embodiments, the thermal conductive layer 306 is a continuous film extending over the semiconductor package PKG1, the gap filling structure 304 and the semiconductor package PKG2. The sidewalls of the thermal conductive layer 306 may be aligned with or laterally shift from sidewalls S2 of the semiconductor packages PKG1/PKG2.

Figure 1D:
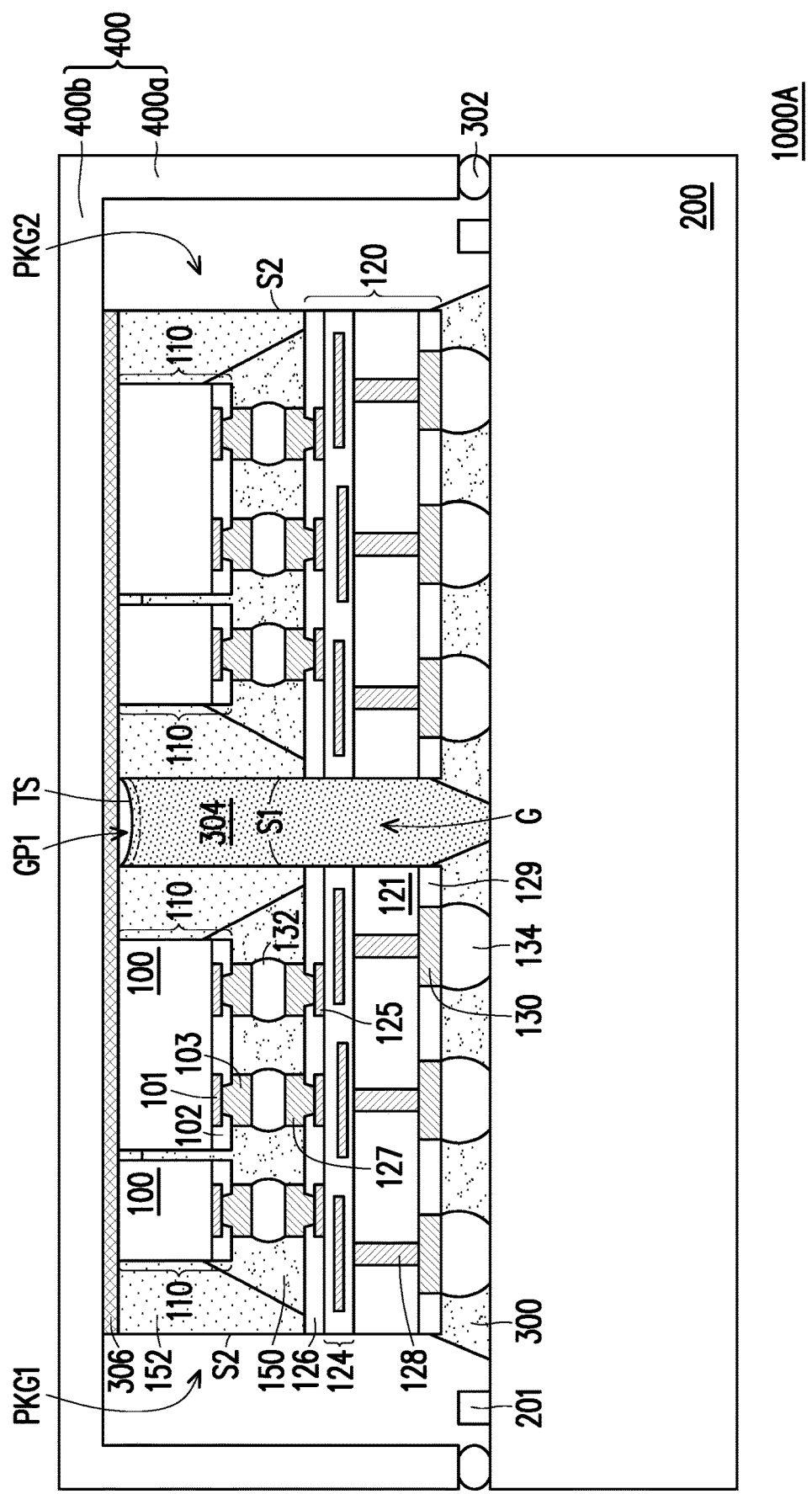

Referring to FIG. 1D, a heat dissipation structure 400 is disposed on the package substrate 200 to cover and surround the semiconductor packages PKG1/PKG2 and/or the passive devices 201. The heat dissipation structure 400 is configured to dissipate heat away from the semiconductor packages PKG1 and PKG2. In some embodiments, the heat dissipation structure 400 is attached to the package substrate 200 through the adhesive material 302. Further, the heat dissipation structure 400 is attached to the semiconductor packages PKG1 and PKG2 through the thermal conductive film 306. In some embodiments, the attachment of the heat dissipation structure 400 includes placing the heat dissipation structure 400 onto the adhesive material 302 over the package substrate 200 and onto the thermal conductive layer 306 over the semiconductor packages PKG1/PKG2, and a curing process is then performed to cure the adhesive material 302 to complete the attachment. In some embodiments, during the curing process, the gap filling structure 304 is also cured. In other words, the curing of the gap filling structure 304 and the curing of the adhesive material 302 may be simultaneously performed after the heat dissipation structure 400 is placed on the package substrate 200. However, the disclosure is not limited thereto. In alternative embodiments, the gap filling structure 304 and the adhesive material 302 may be cured separately in different process stages.

In some embodiments, during the attachment of the heat dissipation structure 400, the heat dissipation structure 400 presses the thermal conductive layer 306 toward the semiconductor packages PKG1/PKG2 and presses the adhesive material 302 toward the substrate 200, such that the thermal conductive layer 306 is spread out between the heat dissipation structure 400 and the semiconductor packages PKG1 and PKG2, and the adhesive material 302 is spread out between the heat dissipation structure 400 and the package substrate 200. In some embodiments, a portion of the thermal conductive layer 306 may be pushed to laterally extend beyond sidewall(s) of the semiconductor packages PKG1 and PKG2. In some embodiments, a portion of the thermal conductive layer 306 may be pushed to fill the recess on the gap filling structure 304. In other words, a portion of the conductive layer 306 may extend downward to fill (e.g., partially or completely fill) the gap between the semiconductor packages PKG1 and PKG2 that is not filled by the gap filling structure 304, and the portion of the conductive layer 306 is over the gap filling structure 304 and laterally between the semiconductor packages PKG1 and PKG2. Further, in the embodiments in which the semiconductor packages PKG1 and PKG2 have different heights, suitable thickness and compressible property of the thermal conductive layer 306 may help to compensate the height difference between the semiconductor packages PKG1 and PKG2.

In some embodiments, the heat dissipation structure 400 is a heat dissipation lid which may be formed of a material having high thermal conductivity, such as steel, stainless steel, copper, the like, or combinations thereof. In addition, the heat dissipation structure 400 may be additionally coated with another metal such as gold.

Figure 2:
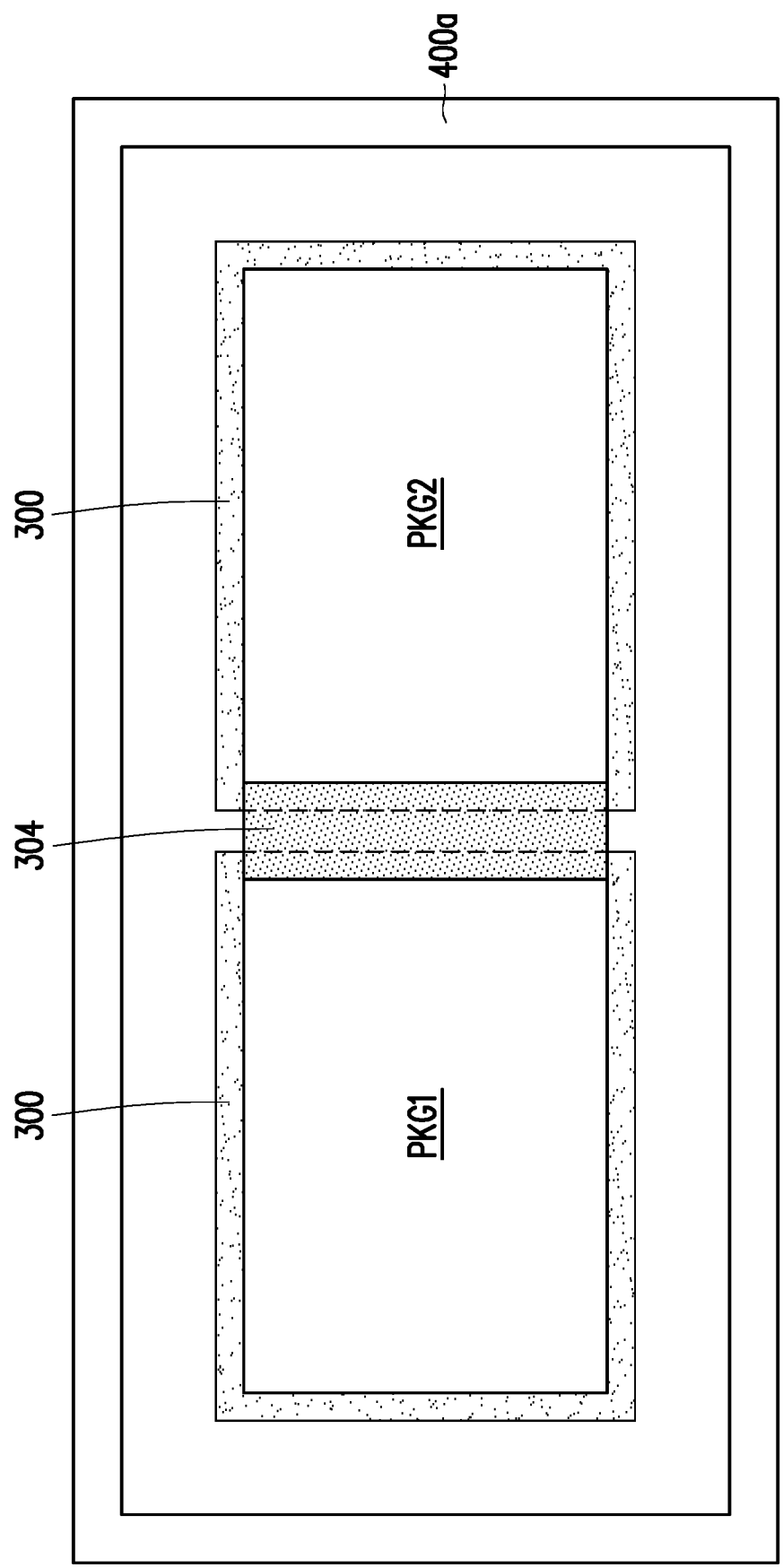
FIG. 2 is a top view illustrating a support portion of a heat dissipation structure, semiconductor packages, underfill material and a gap filling structure of a package structure according to some embodiments of the disclosure.

In some embodiments, the heat dissipation structure 400 includes a support portion 400a and a lid portion 400b connected to each other. The support portion 400a may also be referred to as a leg or a frame of the heat dissipation structure 400. The support portion 400a is landing on and attached to the package substrate 200 through the adhesive material 302. As shown in FIG. 1D and FIG. 2, in some embodiments, the support portion 400a is ring-shaped and laterally surrounding the semiconductor packages PKG1/PKG2 and/or the passive devices 201. It is noted that, the term "ring-shaped" described herein may include circular ring-shape, oval ring-shape, square ring-shaped, rectangular ring-shaped, or the like, or any other suitable types of ring-shaped. The lid portion 400b is in contact with the thermal conductive layer 306 and attached to the semiconductor packages PKG1 and PGK2 through the thermal conductive layer 306. In some embodiments, the lid portion 400b is a plate-shaped. The top view of the lid portion 400b may be circular, oval, square, rectangular, or the like, or any other suitable shape.

In some embodiments, the heat dissipation structure 400 is integrally formed, but the disclosure is not limited thereto. In alternative embodiments, the heat dissipation structure 400 may formed by a plurality of separated pieces. For example, the support portion 400a and the lid portion 400b may be separated parts, and the lid portion 400b may be attached to the support portion 400a by adhesive materials (not shown) disposed therebetween.

As such, a package structure 1000A is thus formed. The package structure 1000A may also be referred to as a chip-on-wafer-on-substrate (CoWoS) package. In some embodiments, the package structure 1000A may further include conductive terminals (not shown) disposed on bottom of the package substrate 200. The conductive terminals are electrically coupled to the semiconductor packages PKG1/PKG2 through the package substrate 200. In some embodiments, the package structure 1000A may further be coupled to other package component through the conductive terminals.

Referring to FIG. 1D, in some embodiments, the package structure 1000A includes the semiconductor packages PKG1 and PKG2, the package substrate 200, the underfill layer 300, the gap filling structure 304, the thermal conductive layer 306 and the heat dissipation structure 400. The semiconductor packages PKG1 and PKG2 are electrically bonded to the package substrate 200. The underfill layers 134 are disposed to fill the space between the semiconductor packages PKG1/PKG2 and the package substrate 200, respectively. In some embodiments, the gap filling structure 304 is disposed to fill the gap G laterally between the semiconductor packages PKG1 and PKG2, such that the semiconductor package PKG1 and the semiconductor package PKG2 are physically connected to each other by the gap filling structure 304 therebetween. In some embodiments, the combination of the semiconductor packages PKG1 and PKG2 and the gap fill structure 304 therebetween may be referred to as a reconstructed semiconductor package disposed on the package substrate 200.

The sidewall S1 of the semiconductor package PKG1 facing the semiconductor package PKG2 and the sidewall S1 of the semiconductor package PKG2 facing the semiconductor package PKG1 are (partially or completely) covered by and in physical contact with gap filling structure 304. In some embodiments, the sidewalls S2 of the semiconductor packages PKG1 and PKG2 opposite to the sidewalls S1 are exposed without being covered by the gap filling structure 304, but the disclosure is not limited thereto. In some other embodiments, more package structures may be disposed laterally aside semiconductor packages PKG1 and/or PKG2, and the gap filling structure may further disposed to fill the gap between the sidewall S2 of the semiconductor package PKG1 and/or PKG2 and the other package structures. Although two package structures and one gap filling structure are shown in the figures, the disclosure is not limited thereto. It should be understood that, more than two package structures may be disposed on the package substrate 200, and more than one gap filling structure may be disposed to fill the gaps between adjacent package structures. In addition, the gap filling structures between different package structures may be connected to each other or separate from each other.

In some embodiments, the gap filling structure 304 covers and physically contact the sidewalls S1 of the semiconductor packages PKG1 and PKG2, the sidewalls of the underfill layers 300 and a portion of the top surface of the package substrate 200. Specifically, the gap filling structure 304 may cover and physically contact the sidewalls of the encapsulants 152, the interposers 120 and/or the dielectric layers 129 of the semiconductor packages PKG1 and PKG2. In some embodiments, the underfill layers 150 are encapsulated by the encapsulant 152 and separated from the gap filling structure 304 by the encapsulant 152 therebetween. In the embodiments, interfaces are existed between the gap filling structure 304 and (e.g., the encapsulant 152, the interposer 120, and/or the dielectric layer 129 of) the semiconductor packages PKG1/PK2, and between the gap filling structure 304 and the underfill layers 300.

In some embodiments, the semiconductor packages PKG1/PKG2 and the gap filling structure 304 are overlaid by the thermal conductive layer 306. The semiconductor packages PKG1/PKG2 are in contact with the thermal conductive layer 306, and the contact area between the respective semiconductor package PKG1/PKG2 and the thermal conductive layer 306 is substantially the same as the area of the top surface of the respective semiconductor package PKG1/PKG2. The gap filling structure 304 may be partially contact or separate from the thermal conductive layer 306. In other words, the contact area between the gap filling structure 304 and the thermal conductive layer 306 is less than the area of the top surface of the gap filling structure 304.

In some embodiments, the top surface TS of the gap filling structure 304 is recessed toward the top surface of the package substrate 200, and a gap GP1 may be existed between the top surface TS of the gap filling structure 304 and the bottom surface of the thermal conductive layer 306. The gap GP1 may be defined by the top surface TS of the gap filling structure 304 and the bottom surface of the thermal conductive layer 306. In alternative embodiments, the gap GP1 may be defined by the top surface TS (shown as the dotted line) of the gap filling structure 304, the bottom surface of the thermal conductive layer 306, and at least one of the sidewalls S1 of the semiconductor packages PKG1 and PKG2.

In some embodiments, the height of the gap GP1 gradually increases as away from the sidewall S1 of the semiconductor package PKG1 and then gradually decreases as approaching the sidewall S1 of the semiconductor package PKG2. For example, the height of the gap GP1 may gradually decreases from the end of the top surface TS contacting the sidewall S1 of the semiconductor package PKG1 to a center point of the top surface TS, and then gradually increases from the center point of the top surface TS to the other end of the top surface TS contacting the sidewall S1 of the semiconductor package PKG2. Herein, the height of the gap GP1 refers to a vertical distance between the top surface TS of the gap filling structure 304 and the bottom surface of the thermal conductive layer 306 in a direction perpendicular to a top surface of the package substrate 200.

Figure 3A:
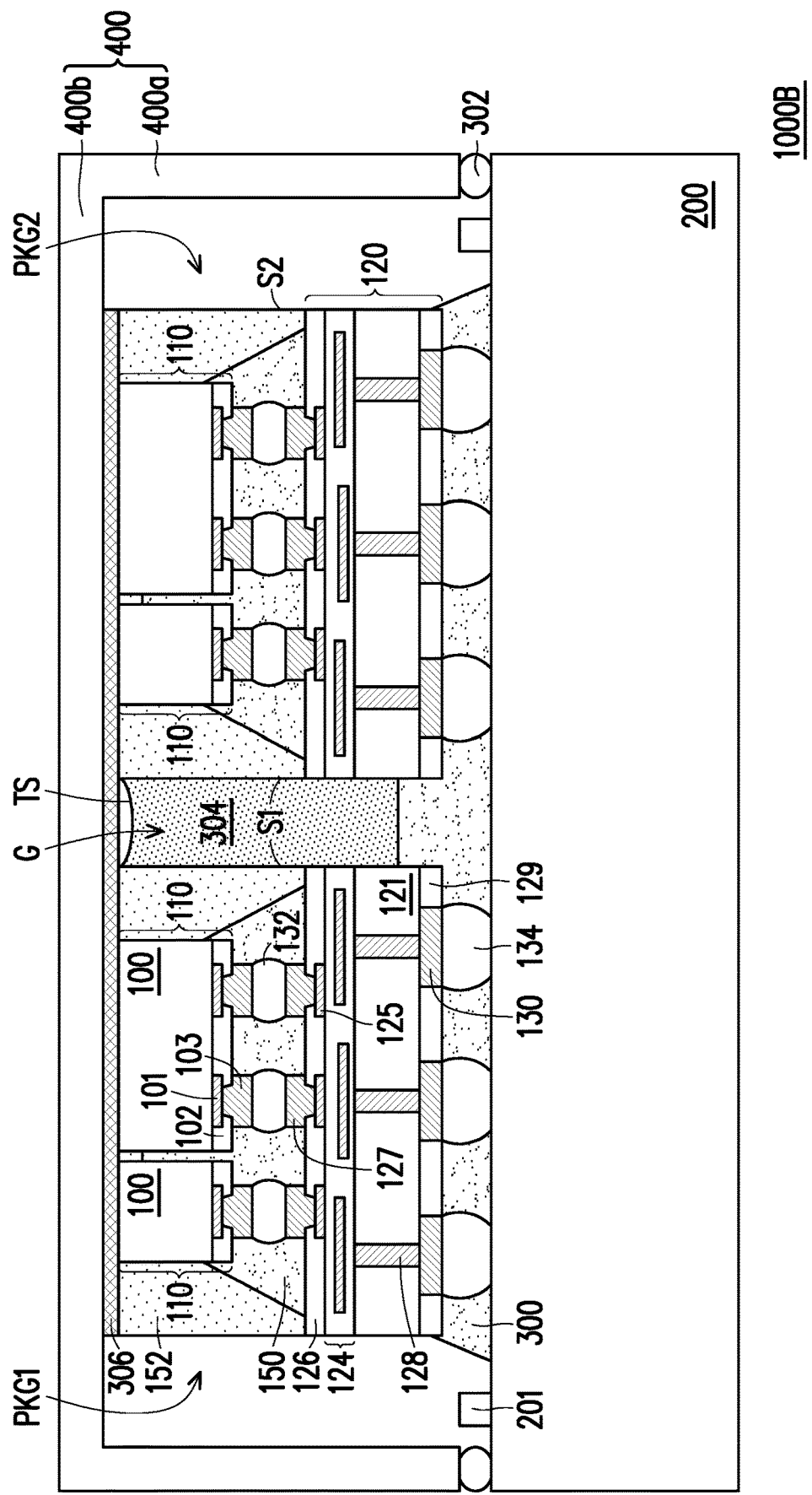
FIG. 3A to FIG. 3C are cross-sectional views illustrating package structures according to some embodiments of the disclosure.
Figure 3B:
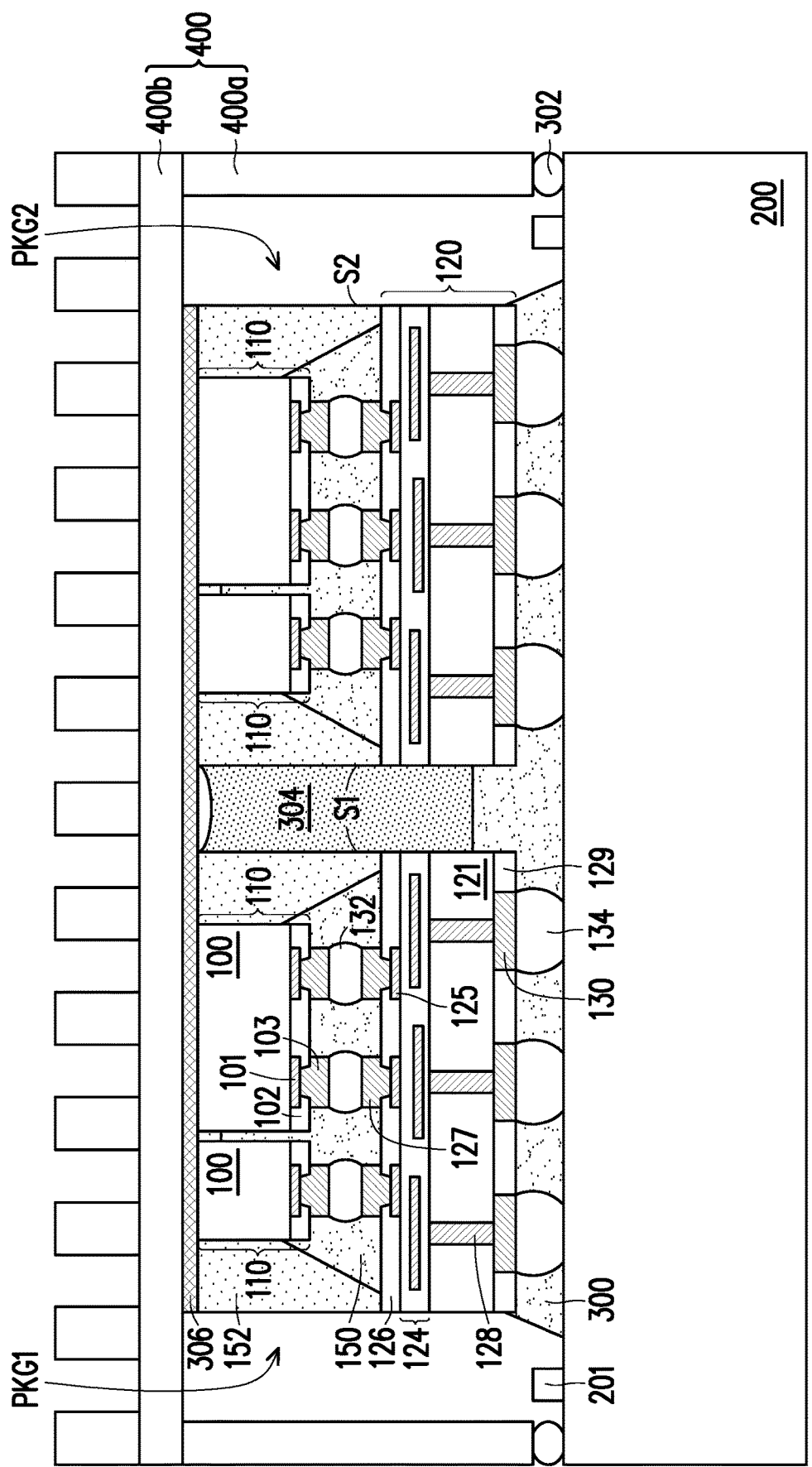
Figure 3C:
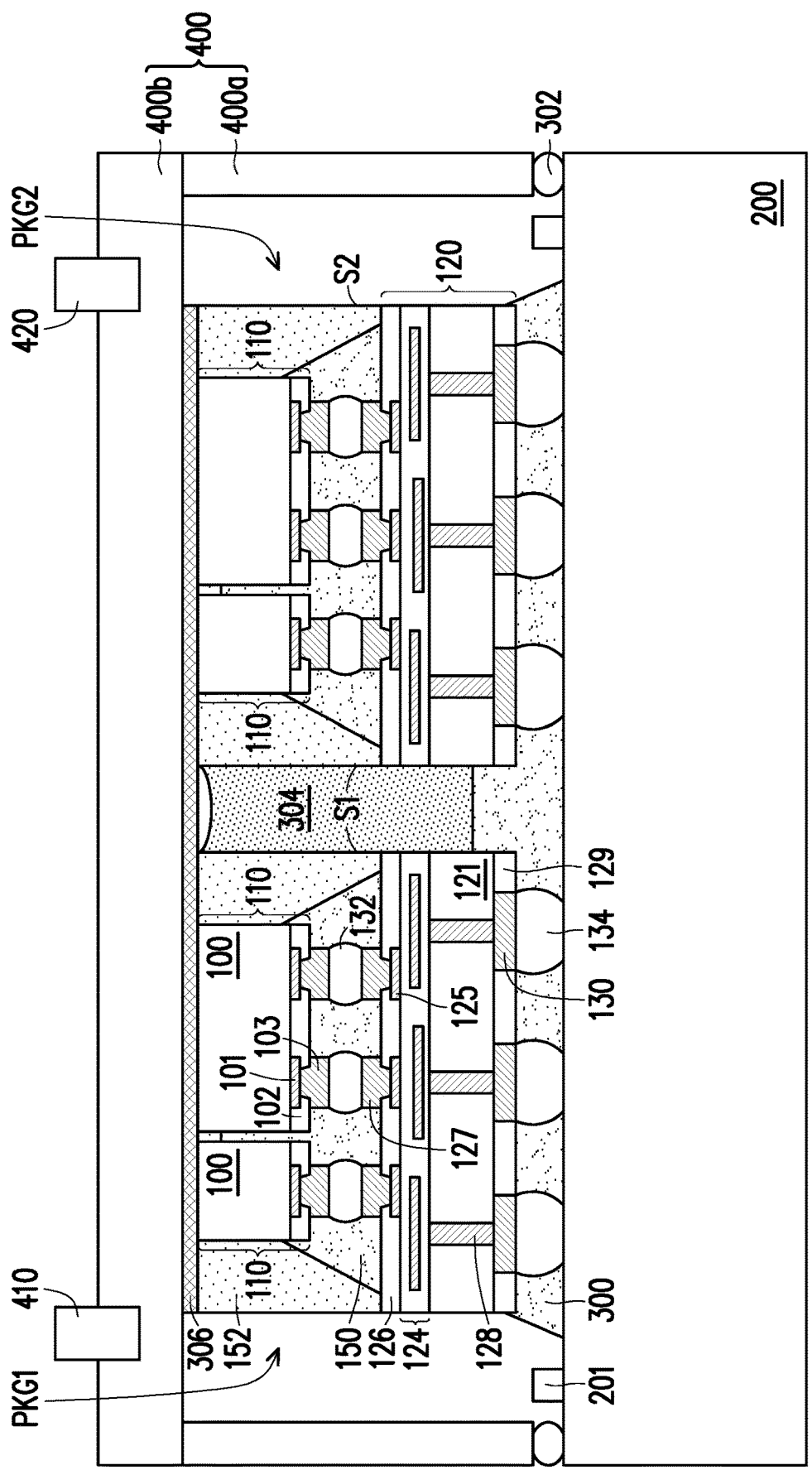

FIG. 3A to FIG. 3C illustrates package structures according to some other embodiments of the disclosure. Like elements are designated with the same reference numbers for ease of understanding and the details thereof are not repeated herein.

Referring to FIG. 3A, a package structure 1000B is illustrated, the package structure 1000B is similar to the package structure 1000A, except that the underfill layer 300 is a continuous layer extending from a space between the semiconductor package PKG1 and the package substrate 200, across the gap G between the semiconductor packages PKG1 and PKG2, and extending to a space between the semiconductor package PKG2 and the package substrate 200. In other words, a portion of the underfill layer 300 may be laterally between the semiconductor packages PKG1 and PKG2 and partially fills the gap G between the semiconductor packages PKG1 and PKG2. The gap filling structure 304 fills into the gap G not filled by the underfill layer 300. The gap filling structure 304 lands on and covers a top surface of the portion of the underfill layer 300. In such an embodiment, the gap filling structure 304 is separated from the package substrate 200 by the underfill layer 300 therebetween. The bottom surface of the gap filling structure 304 is in contact with the top surface of the underfill layer 300 and higher than the top surface of the package substrate 200. In some embodiments, the bottom surface of the gap filling structure 304 may be higher than, substantially coplanar with, or lower than the bottom surface of the dielectric layer 129.

FIG. 3B and FIG. 3C illustrates some alternative choices for the heat dissipation structure 400. Referring to FIG. 3B, in some embodiments, the heat dissipation structure 400 include a heat sink device. For example, the lid portion 400b may be a heat sink device, and the heat sink device is disposed on the support portion 400a. In some embodiments, the heat sink device 400b may be attached to the support portion 400a by adhesive materials (not shown) disposed therebetween. Referring to FIG. 3C, in alternative embodiments, the heat dissipation structure 400 may include a water cooling device. For example, the lid portion 400b is a water cooling device including an inlet 410 and an outlet 420. Water enters the heat dissipation structure 400 from the inlet 410 and exits the heat dissipation structure 400 from the outlet 420. The water cooling device is supported by the support portion 400a and may be attached to the support portion 400a by adhesive materials (not shown).

FIG. 4A to FIG. 4D are cross-sectional views illustrating a method of forming a package structure according to alternative embodiments of the disclosure. Like elements are designated with the same reference numbers for ease of understanding and the details thereof are not repeated herein.

Figure 4A:
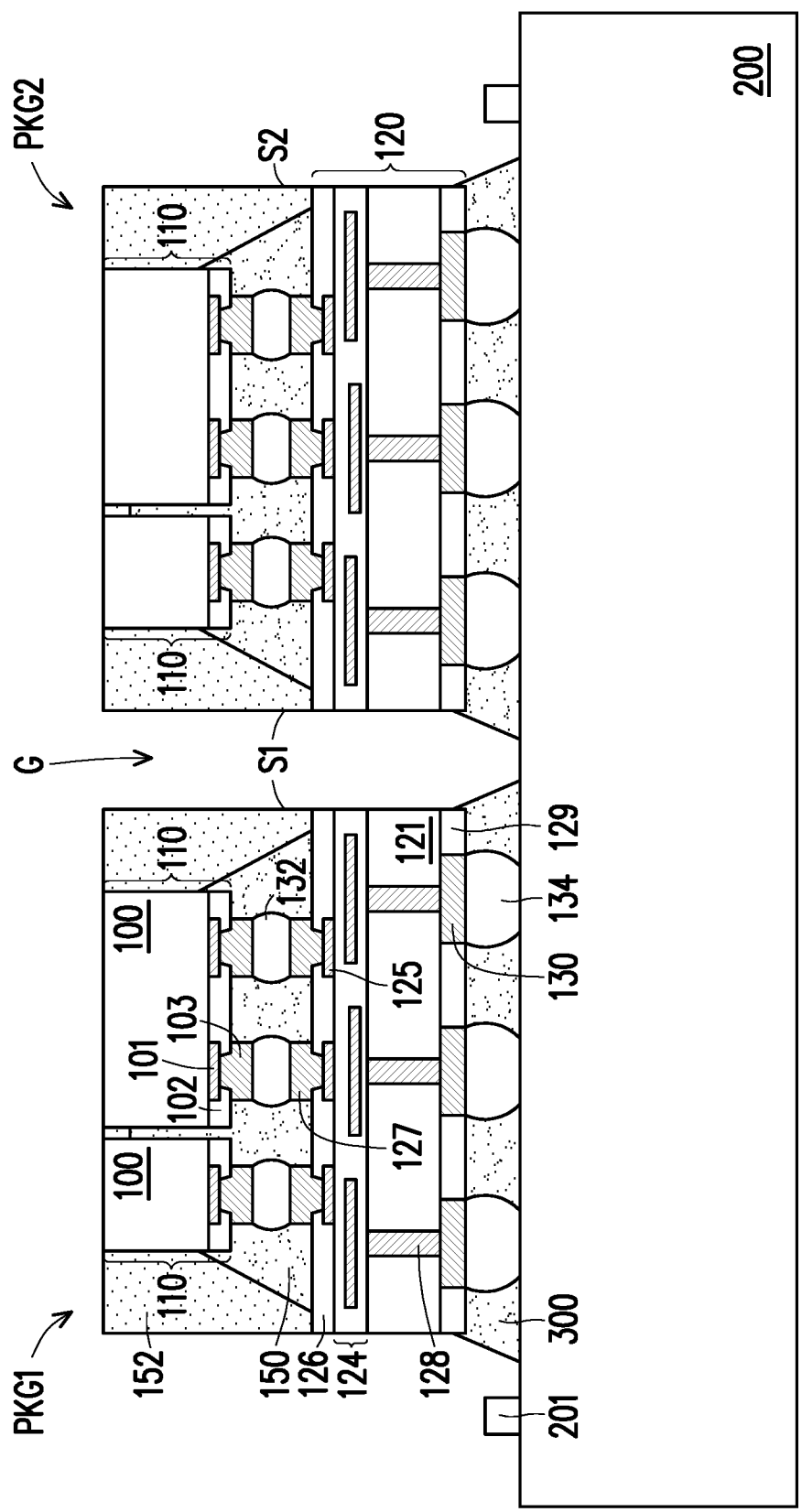
FIG. 4A to FIG. 4D are cross-sectional views illustrating a method of forming a package structure according to some embodiments of the disclosure.

Referring to FIG. 4A, semiconductor packages PKG1 and PKG2 are electrically bonded to the package substrate 200, and underfill layer(s) 300 are disposed to fill the space between the semiconductor packages PKG1/PKG2 and the package substrate 200.

Figure 4B:
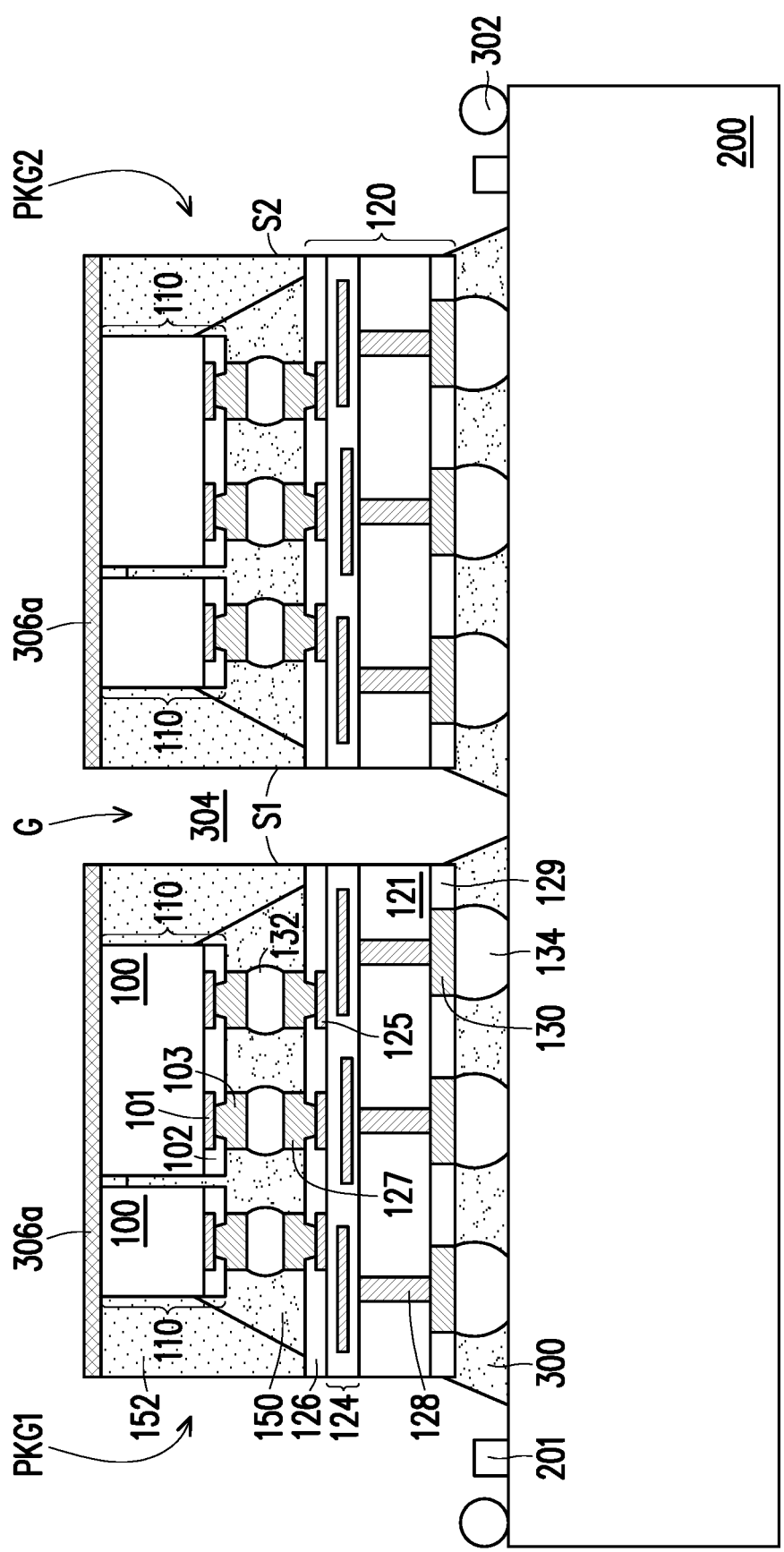

Referring to FIG. 4B, thermal conductive layers 306a and 306b are applied onto the semiconductor packages PKG1/PKG2, respectively. In some embodiments, the thermal conductive layers 306a and 306b are separately formed on the respective semiconductor package PKG1/PKG2. In other words, the thermal conductive layers 306a/306b are non-continuous without across the gap G between the semiconductor package PKG1 and the semiconductor package PKG2. The materials and forming methods of the thermal conductive layers 306a/306b are substantially the same as those of the above-described thermal conductive layer 306, which are not described again here. In some embodiments, the thermal conductive layers 306a and 306b may also be referred to as partitions of thermal conductive layer applied on the semiconductor packages PKG1 and PKG2.

Figure 4C:
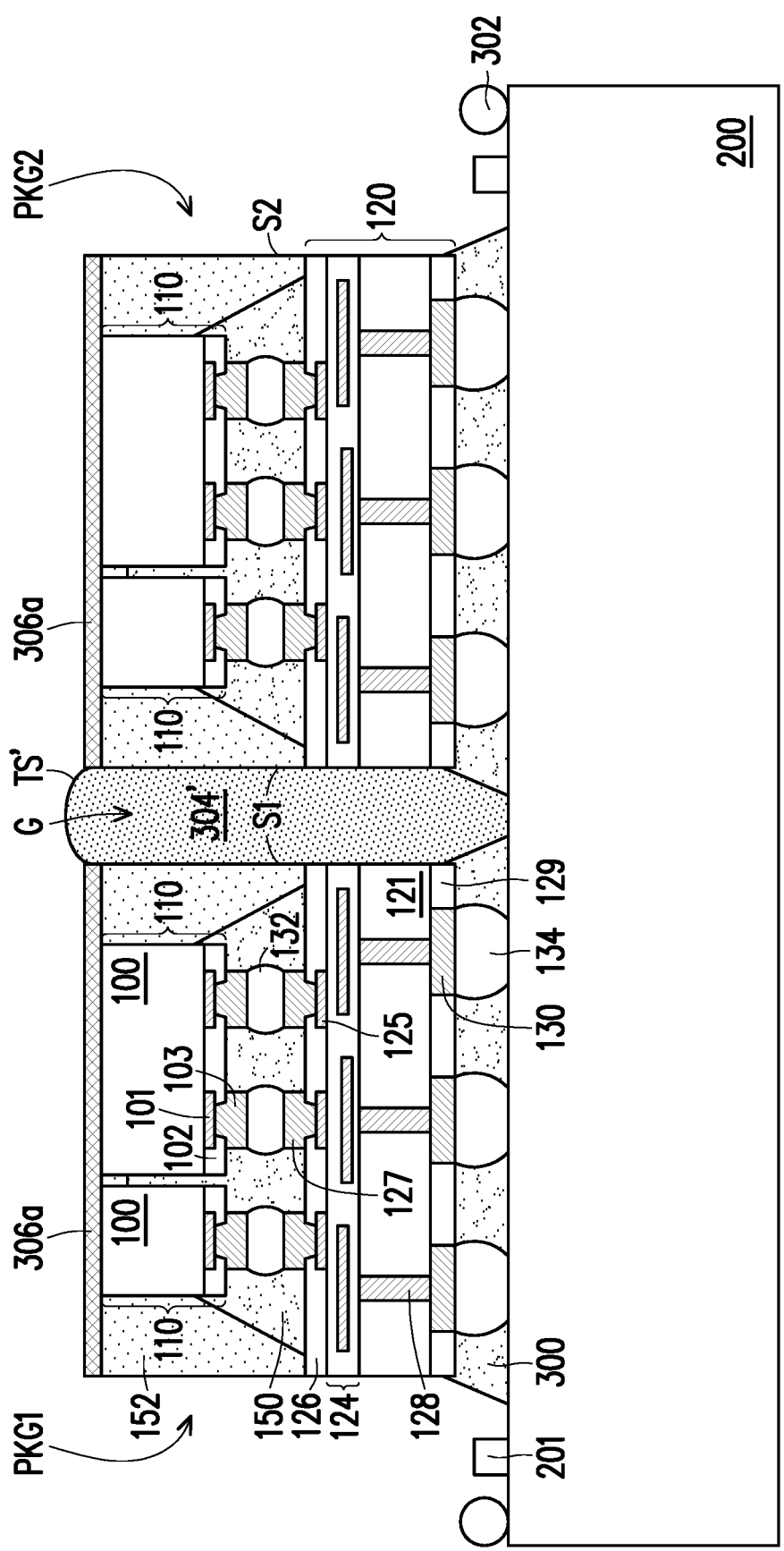

Referring to FIG. 4C, after the thermal conductive layers 306a/306b are formed, an adhesive material 302 is applied on the package substrate 200, and a gap filling structure 304' is formed to fill (e.g., completely fill up) the gap G between the semiconductor packages PKG1/PKG2. In some embodiments, the gap filling material 304' overfills the gap G and may further fill the gap between the thermal conductive layers 306a and 306b. The material and forming method of the gap filling structure 304' are substantially the same as the above-described gap filling structure 304. In some embodiments, the gap filling structure 304' may be formed to have a top surface higher than the top surfaces of the semiconductor packages PKG1/PKG2 and the top surfaces of the thermal conductive layers 306a/306b. In other words, the gap filling structure 304 may protrude from the top surfaces of the semiconductor packages PKG1/PKG2 and the thermal conductive layers 306a/306b. However, the disclosure is not limited thereto.

In some embodiments, the gap filling structure 304' has a convex top surface TS'. For example, the gap filling structure 304' has a first sidewall contacting the sidewall S1 of the semiconductor package PKG1 and a second sidewall opposite to the first sidewall and contacting the sidewall S1 of the semiconductor package PKG2, and the top surface TS' of the gap filling material 304' arcs from the first sidewall to the second sidewall. The vertical distance between the convex top surface TS' of the gap fill material 304' and the package substrate 200 may gradually increase as laterally away from the semiconductor package PKG1 and then gradually decrease as laterally approaching the semiconductor package PKG2 in a lateral direction. For example, the level height of the top surface TS' relative to the top surface of the package substrate 200 may gradually increase from the end connected to the first sidewall of the gap filling structure 304' to a center point of the top surface TS', and then gradually decrease from the center point to the other end connected to the second sidewall of the gap filling structure 304'.

Figure 4D:
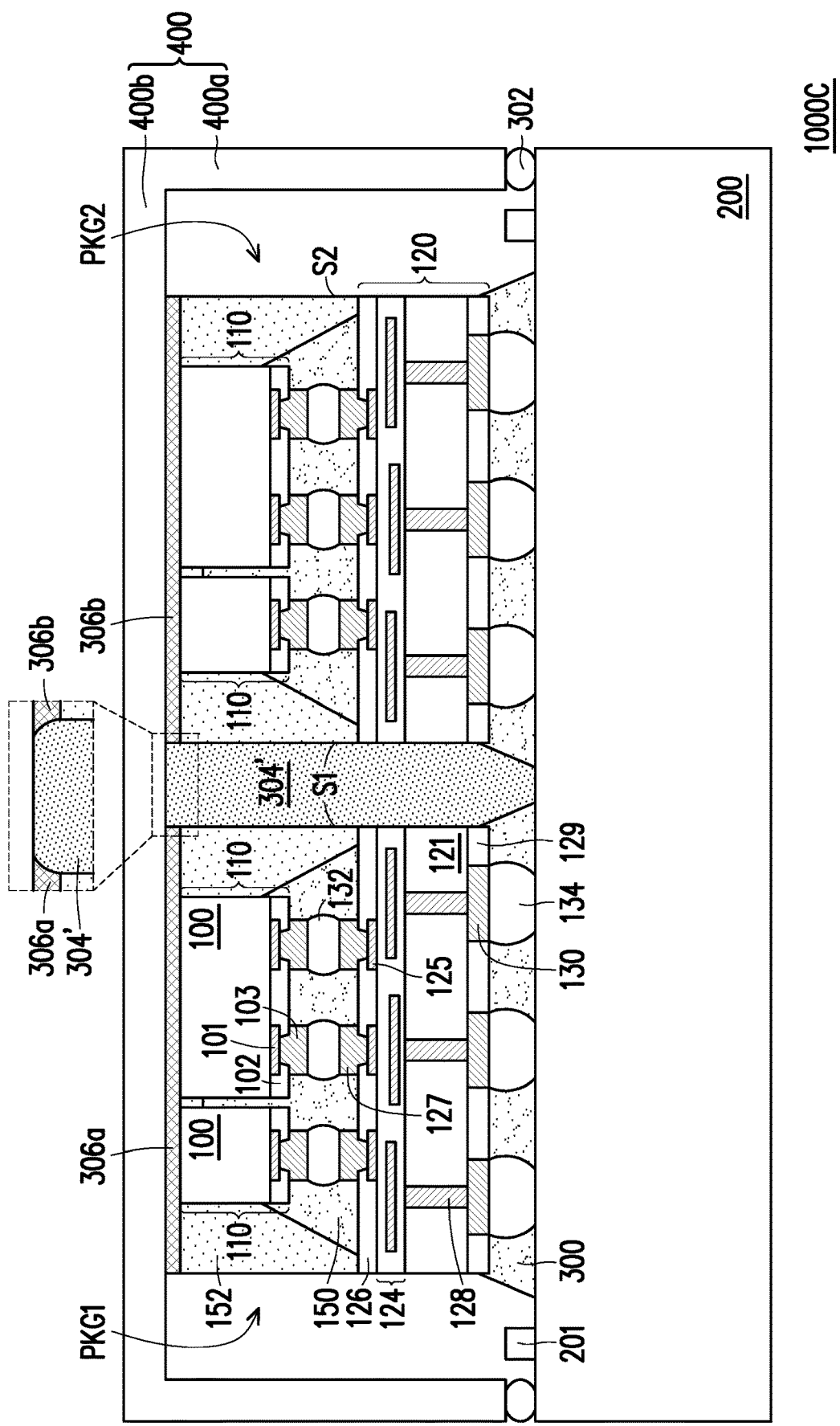

Referring to FIG. 4D, a heat dissipation structure 400 is disposed on the package substrate 200 to cover and surround the semiconductor packages PKG1 and PKG2 and/or the passive devices 201. The support portion 400a of the heat dissipation structure 400 is placed on the adhesive materials 302, and the lid portion 400b is placed on the thermal conductive layers 306a/306b and the gap filling structure 304'. Thereafter, a curing process is performed to cure the adhesive material 302 and the gap filling structure 304'. In some embodiments, due to the mechanical pressure from the heat dissipation structure 400, the convex top surface TS' (FIG. 4C) of the gap filling structure 304' is pressed to be planar, and the gap filling structure 304a' has a substantially planar top surface corresponding to the bottom surface of the heat dissipation structure 400.

In some embodiments, the interfaces between the gap filling structure 304a' and the thermal conductive films 306a/306b may be substantially aligned with the corresponding sidewalls S1 of the semiconductor packages PKG1 and PKG2, but the disclosure is not limited thereto. In some other embodiments, the interfaces between the gap filling structure 304' and the thermal conductive films 306a/306b may be laterally shifted from the sidewalls S1 of the semiconductor packages PKG1 and PKG2. In some embodiments, as shown in the enlarged view, since the thermal conductive layers 306a/306b are compressive, the thermal conductive layers 306a/306b may be pushed toward the gap filling structure 304', and the sidewalls of the thermal conductive layers 306a/306b may be arced. Accordingly, the interfaces between the thermal conductive layers 306a/306b and the gap filling structure 304' may be arced. A portion of the gap filling structure 304' between the thermal conductive layers 306a/306b may have a non-uniform width and may be tapered away from the top surface of the package substrate 200. However, the disclosure is not limited thereto.

As such, a package structure 1000C is thus formed. The package structure 1000C includes the semiconductor packages PKG1 and PKG2, the package substrate 200, the underfill layers 300, the thermal conductive layers 306a and 606b, the gap filling structure 304', and the heat dissipation structure 400.

In some embodiments, the gap filling structure 304' is disposed on the package substrate 200 and fills into (e.g., completely fill) the gap laterally between the package structures PGK1 and PKG2 and the gap laterally between the thermal conductive layers 306a and 306b. The gap filling structure 304a' covers and physically contact sidewalls of the thermal conductive layers 306a/306b, sidewalls S1 of the semiconductor packages PKG1 and PKG2, sidewalls of the underfill layers 300 and the top surface of the package substrate 200. The top surface of the gap filling structure 304' is higher than the top surfaces of the semiconductor packages PKG1/PKG2, and may be substantially coplanar with the top surfaces of the thermal conductive layers 306a and 306b. In some embodiments, the top surface of the gap filling structure 304a' is in contact with the bottom surface of the heat dissipation structure 400, and the contact area between the gap fill structure 304a' and the heat dissipation structure 400 may be substantially equal to the area of the top surface of the gap filling structure 304a'. The other features of the package structure 1000C are substantially the same as the package structure 1000A, which are not described again here.

FIG. 5A to FIG. 5D illustrates cross-sectional views of package structures according to some other embodiments of the disclosure.

Figure 5A:
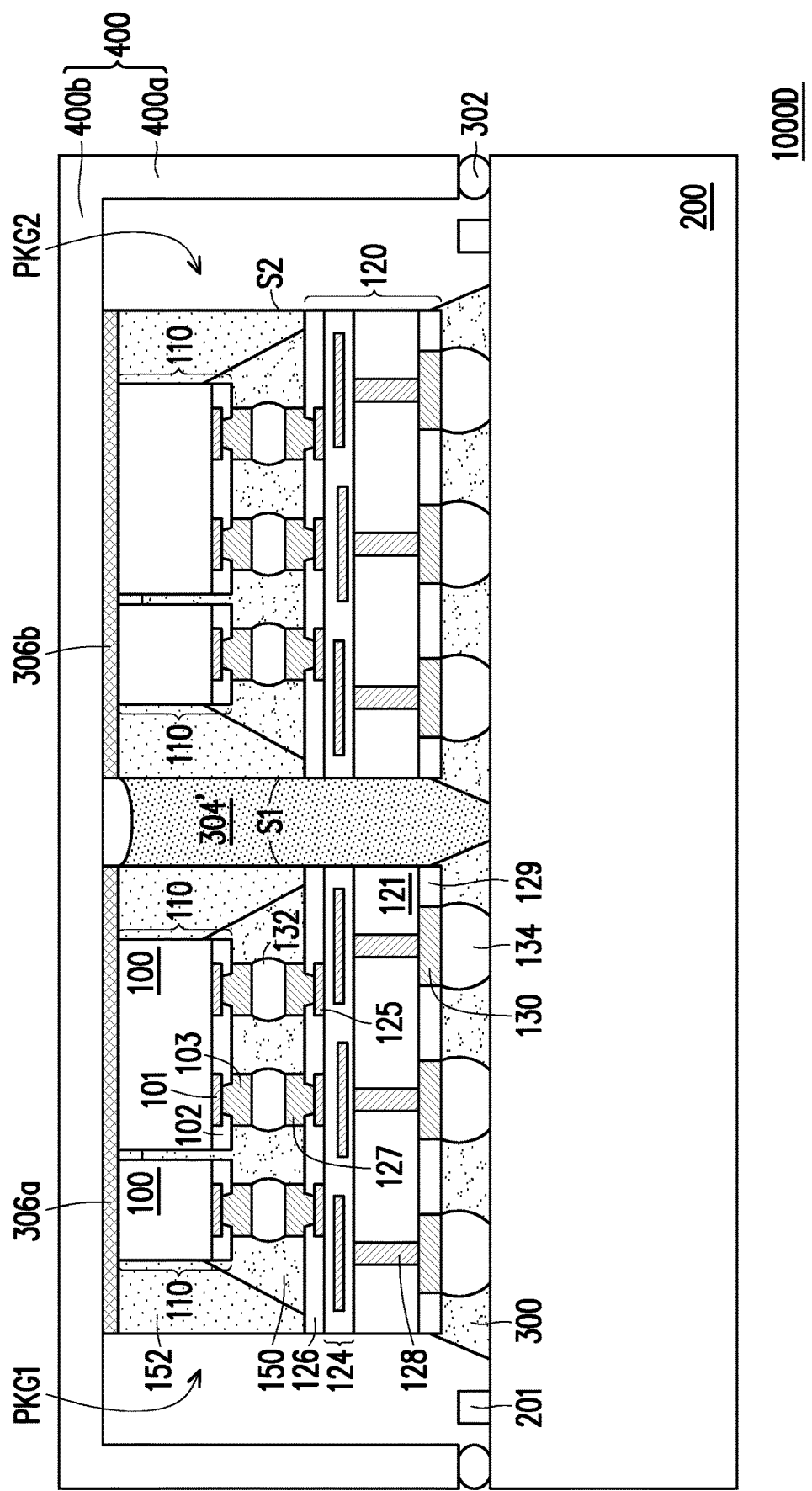
FIG. 5A to FIG. 5D are cross-sectional views illustrating package structure according to some embodiments of the disclosure.

Referring to FIG. 5A, a package structure 1000D is illustrated. The package structure 1000D is similar to the package structure 1000C, except that a gap is existed between the top surface of the gap filling structure 304' and the lid portion 400b of the heat dissipation structure 400. In some embodiments, the top surface of the gap filling structure 304' is lower than the top surface of the thermal conductive layers 306a/306b and may be higher than, substantially coplanar with or lower than the top surfaces of the semiconductor packages PKG1 and PKG2. In such an embodiment, the gap filling structure 304' may be dispensed to fill the gap between the semiconductor packages PKG1 and PKG2 before or after the formation of the thermal conductive layers 306a/306b.

Figure 5B:
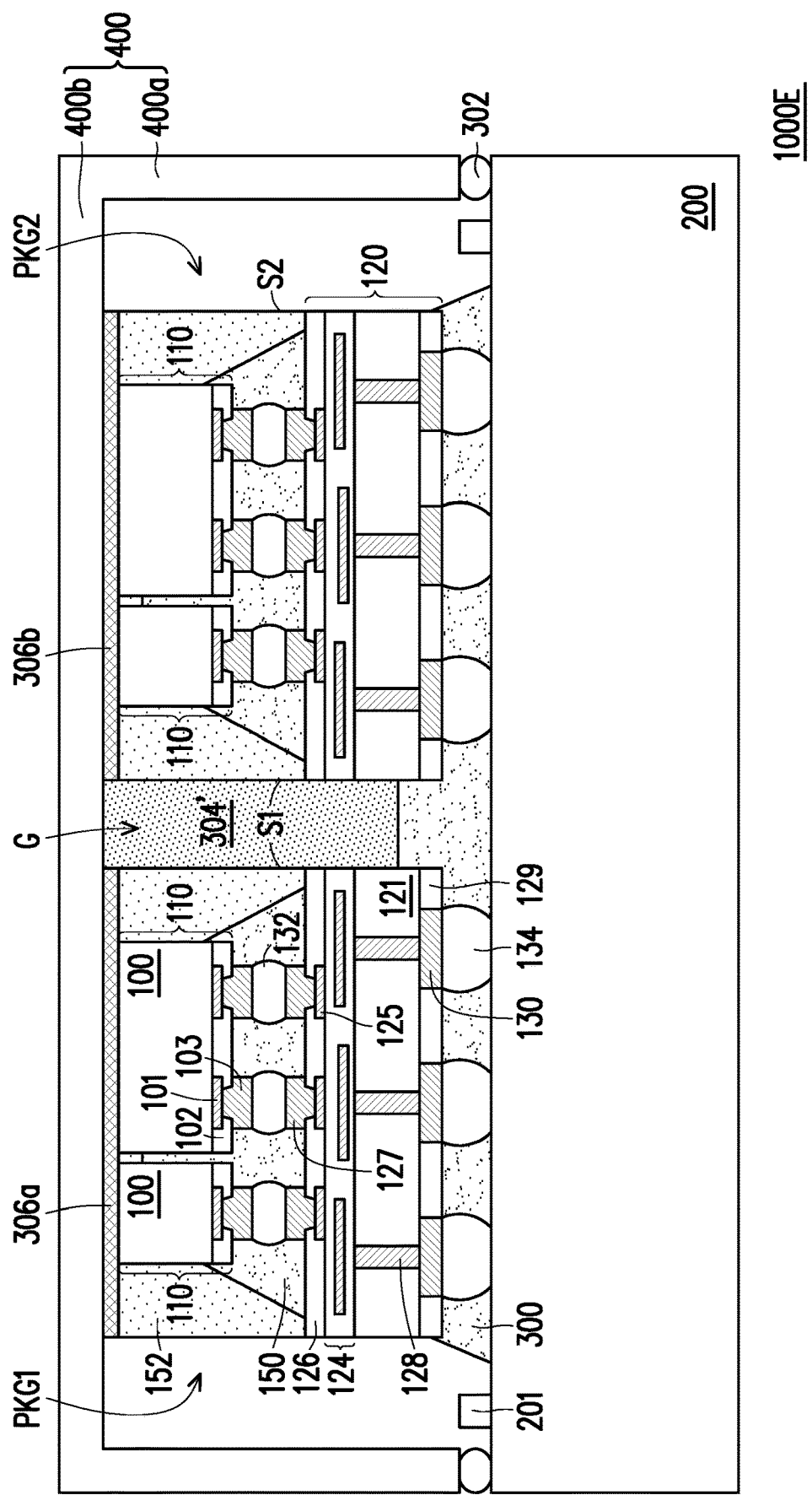

FIG. 5B illustrates a package structure 1000E, which is similar to the package structure 1000C, except that the underfill layer 300 is a continuous layer extending from a space between the semiconductor package PKG1 and the package substrate 200, across the gap between the semiconductor packages PKG1 and PKG2 and extending to a space between the semiconductor package PKG2 and the package substrate 200. The gap filling structure 304' lands on the underfill layer 300 and is separated from the package substrate 200 by the underfill layer 300 therebetween.

Figure 5C:
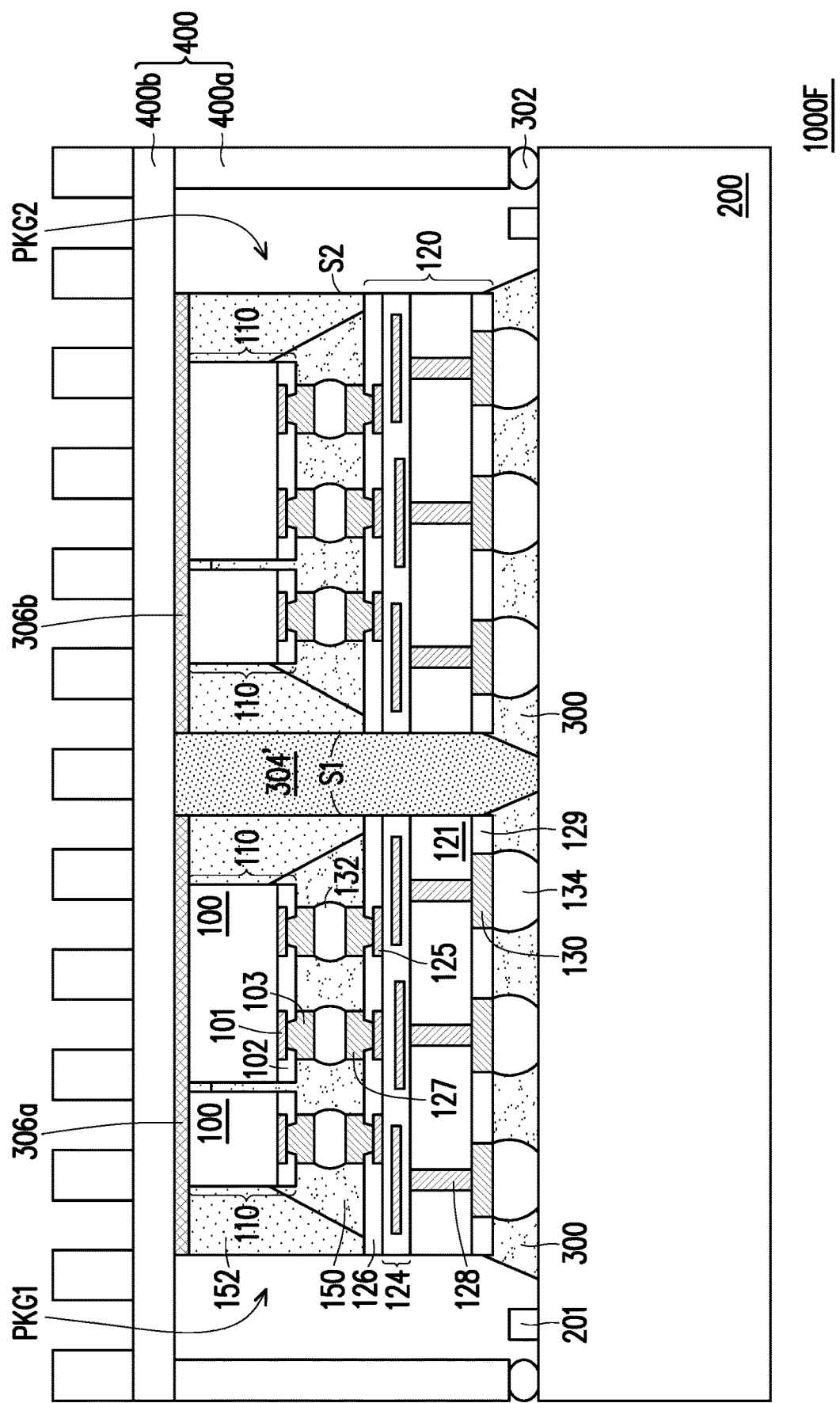
Figure 5D:
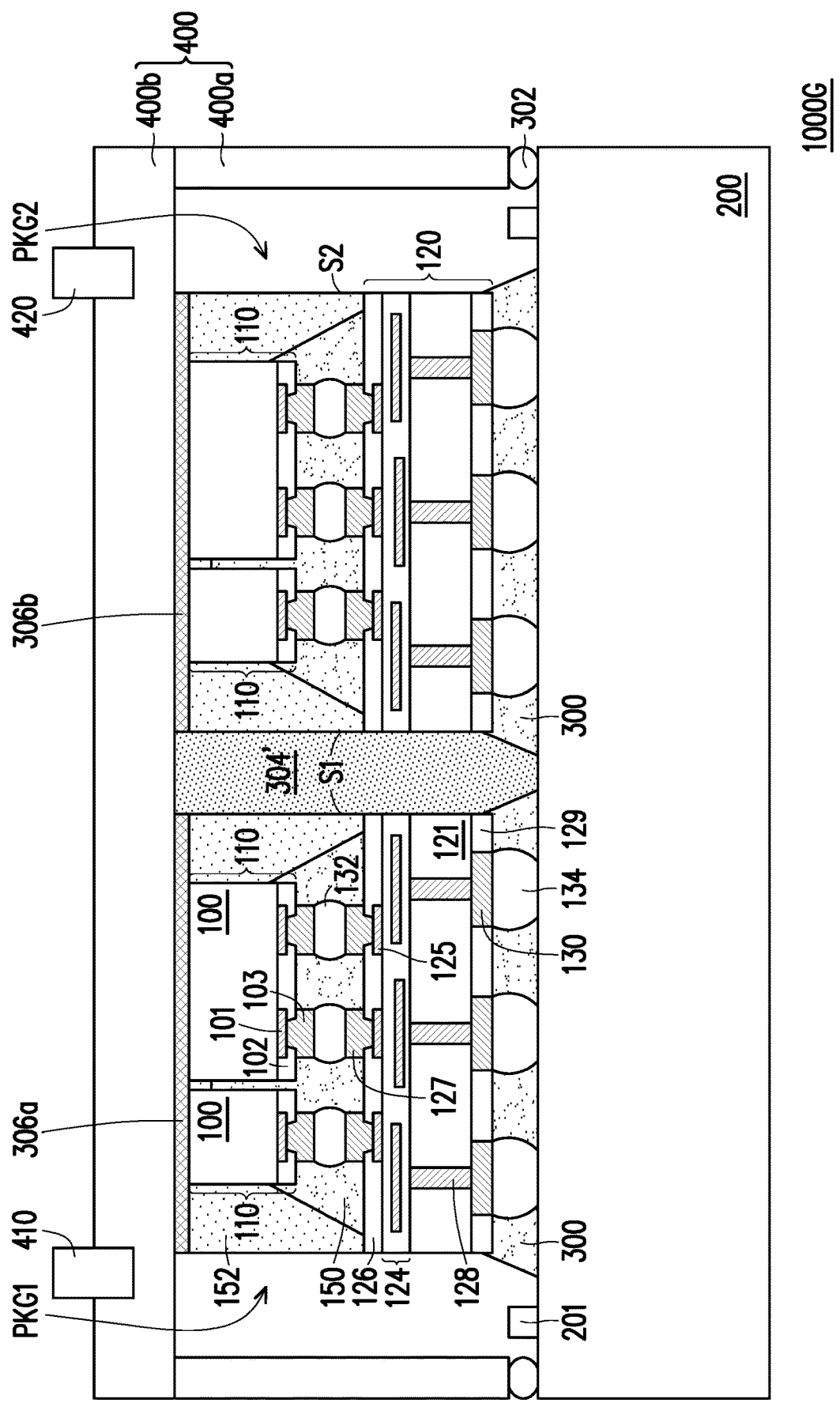

FIG. 5C illustrates a package structure 1000F, which is similar to the package structure 1000C, except that the lid portion 400b of the heat dissipation structure 400 is a heat sink device. FIG. 5D illustrates a package structure 1000G, which is similar to the package structure 1000C, except that the lid portion 400b of the heat dissipation structure 400 is a water cooling device.

FIG. 6A to FIG. 6E are cross-sectional views illustrating a method of forming a package structure according to some other embodiments of the disclosure. Like elements are designated with the same reference numbers for ease of understanding and the details thereof are not repeated herein. FIG. 7 illustrates a top view of a support component, semiconductor packages and underfill material of a package structure according to some embodiments of the disclosure.

Figure 6A:
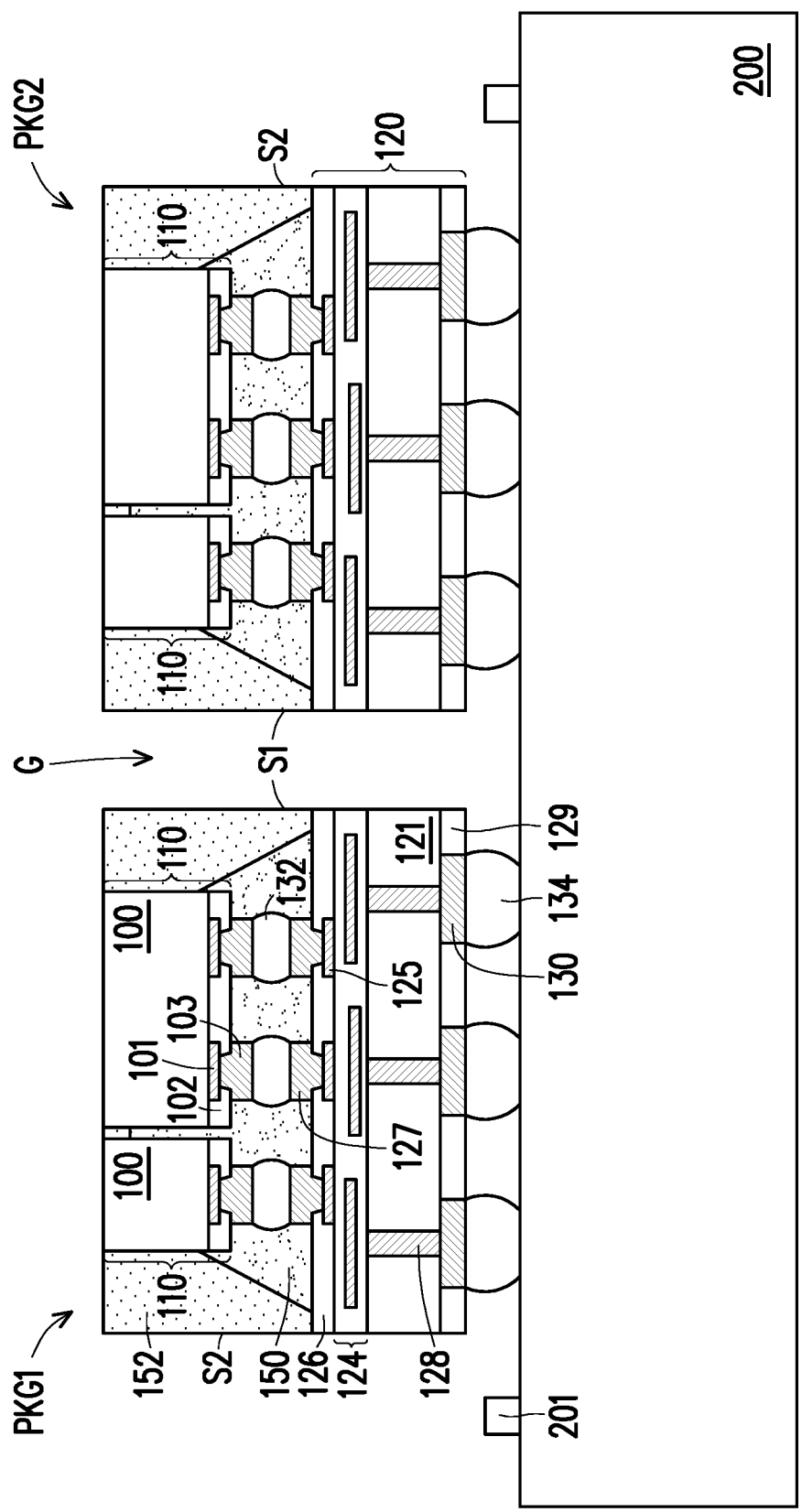
FIG. 6A to FIG. 6E are cross-sectional views illustrating a method of forming a package structure according to some embodiments of the disclosure.
Figure 7:
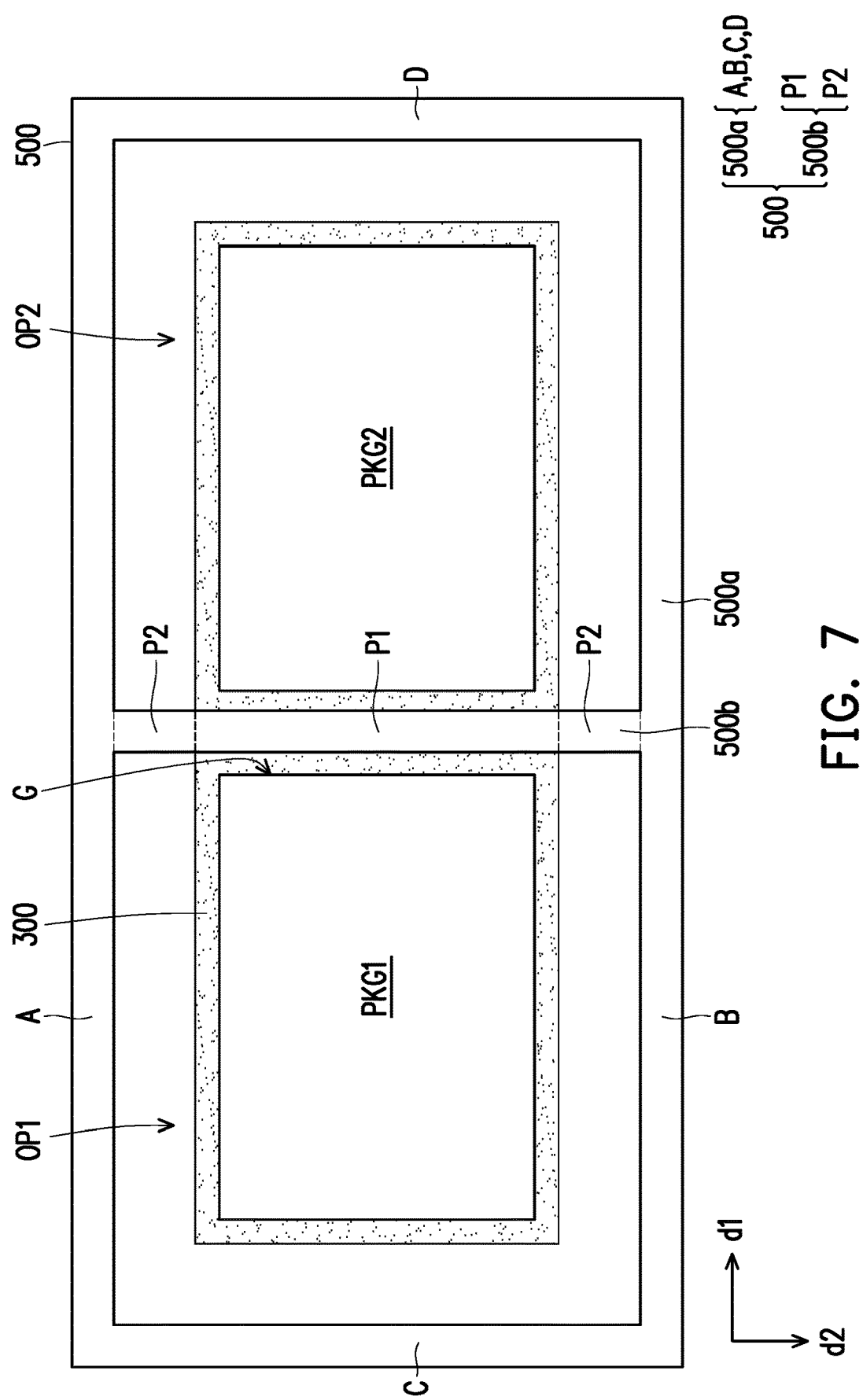
FIG. 7 is a top view illustrating a support component of a heat dissipation structure, semiconductor packages and underfill material of a package structure according to some embodiments of the disclosure.

Referring to FIG. 6A, semiconductor packages PKG1 and PKG2 are electrically bonded to the package substrate 200.

Figure 6B:
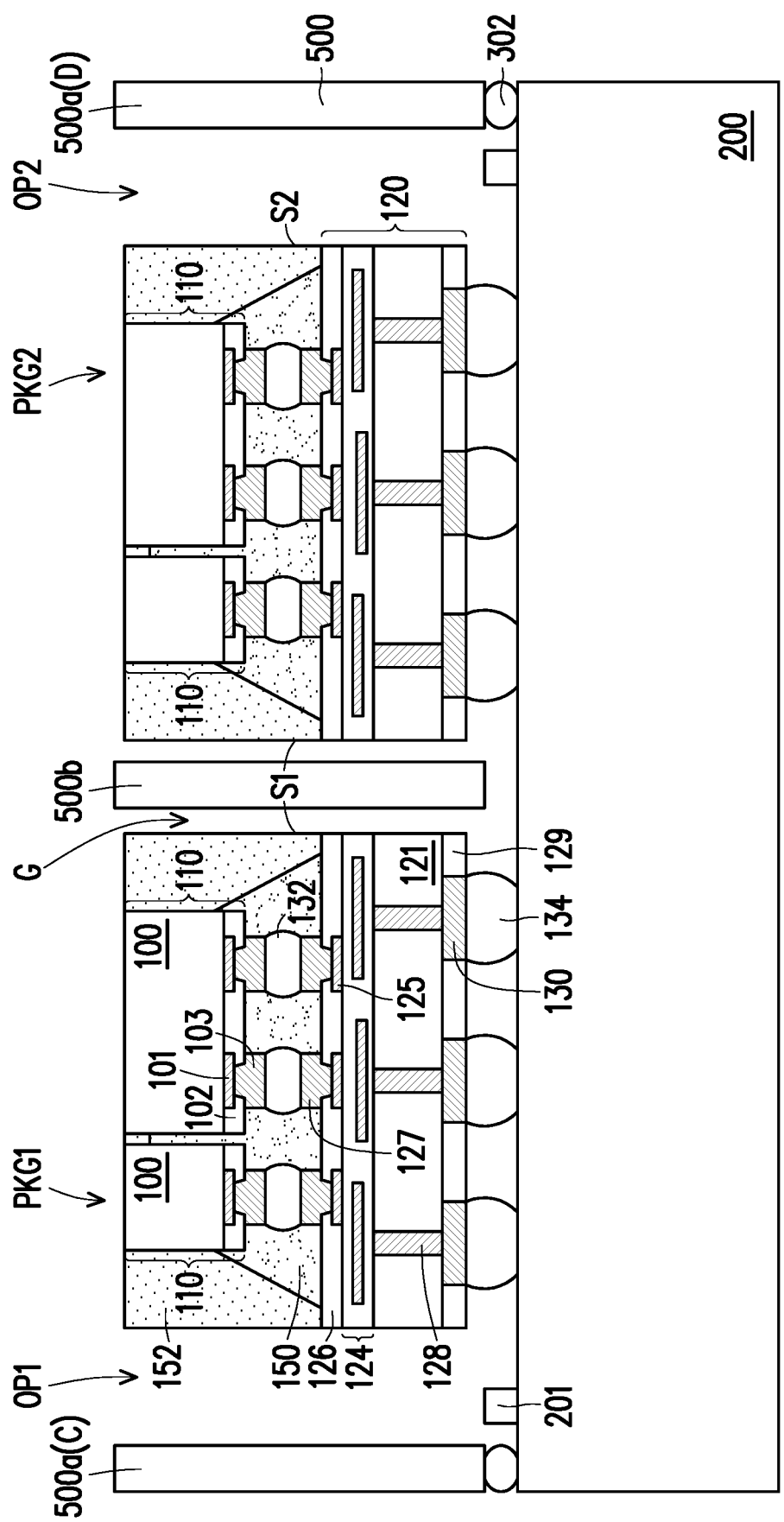

Referring to FIG. 6B, a support component 500 is disposed on the package substrate 200 and laterally aside the semiconductor packages PKG1 and PKG2. In some embodiments, the support component 500 is a frame configured for supporting the lid of heat dissipation structure.

Referring to FIG. 6B and FIG. 7, in some embodiments, the support component 500 includes a body part 500a and an additional part 500b connected to each other. The support component 500 including body part 500a and the additional part 500b may be integrally formed, but the disclosure is not limited thereto. In alternative embodiments, the support component 500 may be formed by a plurality of separate pieces.

The body part 500a may be ring shaped, such as square ring-shaped, rectangular ring-shaped, circular ring-shaped, oval ring-shaped, or the like, or other suitable types of ring-shaped. The additional part 500b is connected to (e.g., inner sidewalls of) the body part 500a and laterally between opposite portions of the body part 500a. For example, the body part 500a is square or rectangular ring-shaped, and includes two pairs of side parts, such as side parts A, B, C, D connected to each other. The side parts A and B are opposite to each other and extending in parallel along a first direction d1. The side parts C and D are opposite to each other and extending in parallel along a second direction d2 substantially perpendicular to the first direction d1. The side parts C and D are connected to the ends of the side parts A and B, so as to constitute a ring-shaped body part 500a. The additional part 500b is disposed between and connected to the side parts A and B, and laterally between and spaced apart from the side parts C and D. In some embodiments, the additional part 500b is extending in parallel with the side parts C and D along the second direction d2.

Still referring to FIG. 6B and FIG. 7, the support component 500 has an opening OP1 and an opening OP2. The opening OP1 is defined by the sidewalls of the side part C, portions of the side parts A and B and the additional part 500b, while the opening OP2 is defined by the sidewalls of the side part D, portions of the side parts A and B and the additional part 500b. In some embodiments, the semiconductor packages PKG1 and PKG2 are disposed in the openings OP1 and OP2 of the support component 500, respectively. The semiconductor package PKG1 is laterally surrounded by the side parts C and portions of the side parts A and B of the body part 500a and the additional part 500b of the support component 500. The semiconductor package PKG2 is laterally surrounded by the side parts C and other portions of the side parts A and B of the body part 500a and the additional part 500b of the support component 500. In some embodiments, the semiconductor packages PKG1/PKG2 are laterally spaced apart from the corresponding parts of the support component 500.

In other words, the additional part 500b of the support component 500 is disposed in the gap G between the semiconductor package PKG1 and the semiconductor package PKG2. The additional part 500b is laterally between and may be spaced apart from the semiconductor packages PKG1 and PKG2. The top surface of the support component 500 may be higher than, substantially coplanar with or lower than the top surfaces of the semiconductor packages PKG1 and PKG2. The bottom surface of the support component are higher than the top surface of the package substrate 200, and may be lower than, substantially coplanar with, or slightly higher than the bottom surfaces of the dielectric layers 129 of the semiconductor packages PKG1 and PKG2.

In some embodiments, the support component 500 is attached to the package substrate 200 through adhesive material 302. The adhesive material 302 may be applied on the top surface of the package substrate 200 before placing the support component 500 on the adhesive material 302. Alternatively, the adhesive material 302 may be initially applied on the bottom surface of the support component 500, and the support component 500 with the adhesive material 302 is then placed onto the package substrate 200.

In some embodiments, the adhesive material 302 may be a continuous layer extending between the support component 500 and the package substrate 200. In some other embodiments, the adhesive material 302 may include a plurality of discrete sections disposed between the support component 500 and the package substrate 200 and laterally spaced apart from each other. In some embodiments, the adhesive material 302 is disposed between the body part 500a and the package substrate 200, and is not disposed between the additional part 500b and the package substrate 200. At the stage of FIG. 6B, the body part 500a of the support component 500 lands on the adhesive materials 302 over the package substrate 200, while the additional part 500b hangs over the package substrate 200 without an adhesive material disposed therebetween. However, the disclosure is not limited thereto. In some other embodiments, the adhesive material 302 may further be disposed between at least a portion of the additional part 500b and the package substrate 200.

Figure 6C:
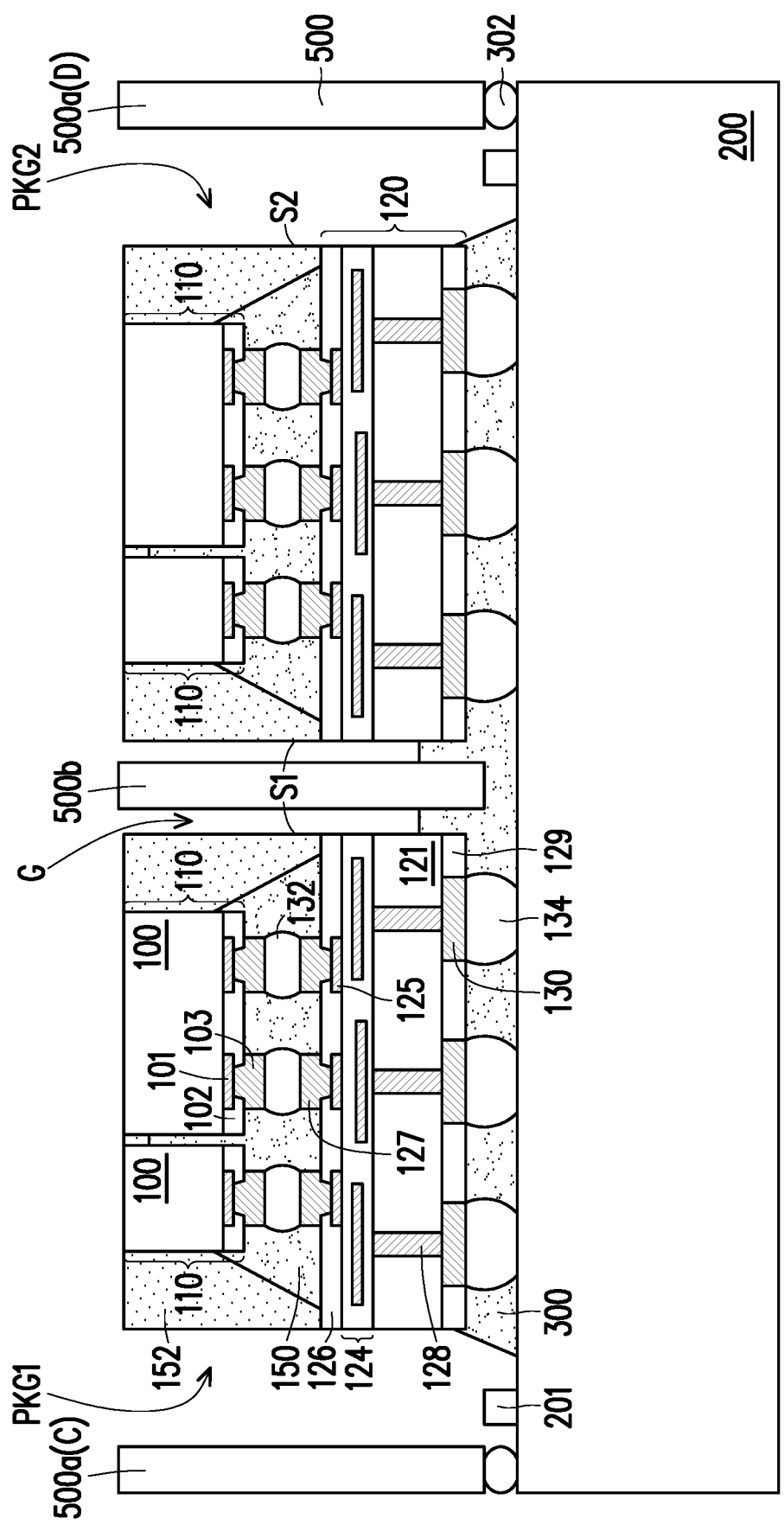

Referring to FIG. 6C, in some embodiments, after the support component 500 is attached to the package substrate 200, an underfill layer 300 is disposed to fill the spaces between the semiconductor packages PKG1/PKG2 and the package substrate 200. The underfill layer 300 may be formed to be a continuous layer extending from a space between the semiconductor package PKG1 and the package substrate 200 to a space between the semiconductor package PKG2 and the package substrate 200. A portion of the underfill layer 300 partially fills the gap G between the semiconductor packages PKG1/PKG2 and covers portions of sidewalls and bottom surface of the additional part 500b. In some embodiments, the portion of the underfill layer 300 serves as an adhesive between the additional part 500b and the package substrate 200 to fix the additional part 500b. That is to say, the additional part 500b of the support component 500 is attached to the package substrate 200 through a portion of the underfill layer 300.

Referring to FIG. 6C and FIG. 7, in some embodiments, the underfill layer 300 is disposed around the semiconductor package PKG1 and PKG2 and may be laterally spaced apart from the body part 500a of the support component 500. In some embodiments, a portion of the underfill layer 300 is disposed between a portion P1 of the additional part 500b and the package substrate 200, and is not disposed between a portion P2 of the additional part 500b and the package substrate 200. In other words, the portion P2 of the additional part 500b may overhang the package substrate 200 without underfill layer disposed therebetween, but the disclosure is not limited thereto. In some other embodiments, the underfill layer 300 may further be disposed between the portion P2 of the additional part 500b and the package substrate 200. In other words, the underfill layer 300 may be formed to fill the space between a part or whole part of the additional part 500b and the package substrate 200. In some embodiments, by using a portion of the underfill layer 300 as an adhesive to attach the additional part 500b to the package substrate 200, the process is simplified. On the other hand, without additional adhesive material disposed between the additional part 500b and the package substrate 200, no heterogeneous interface would be existed between the underfill material and the adhesive material. However, the disclosure is not limited thereto.

In some alternative embodiments, a portion of the adhesive material 302 may be disposed between the portion P2 of the additional part 500b and the package substrate 200, and the portion of the adhesive material 302 may be in contact with or spaced apart from the underfill layer 300. That is to say, the additional part 500b may be attached to the package substrate 200 through underfill layer 300, the adhesive material 302 or combinations thereof.

Figure 6D:
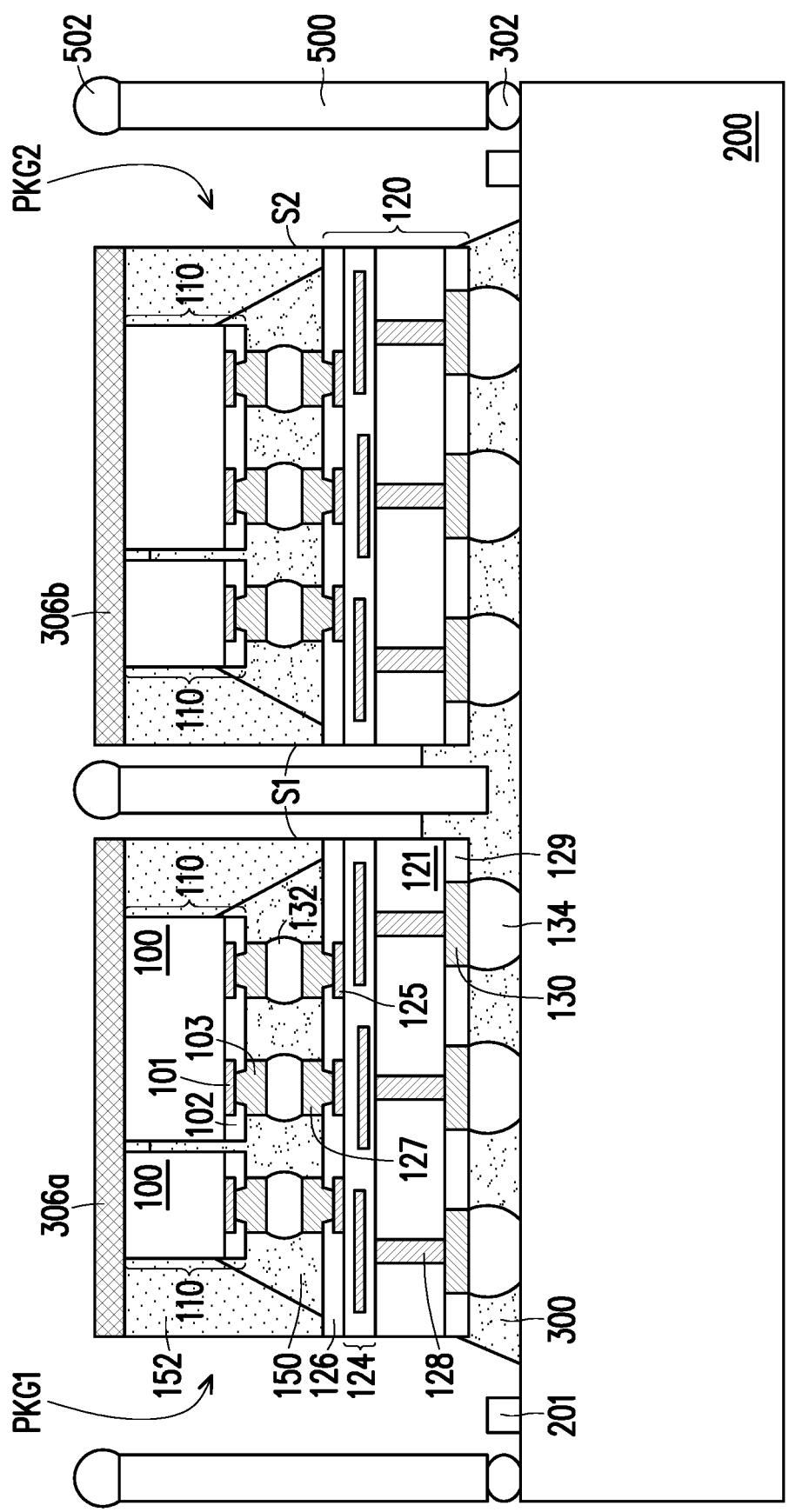

Referring to FIG. 6D, thermal conductive layers 306a and 306b are formed on the semiconductor packages PKG1 and PKG2, respectively. An adhesive material 502 is applied onto the top of the support component 500 for the attachment to a lid. The adhesive material 502 may be disposed on both of the body part 500a and the additional part 500b of the support component 500. In some embodiments, the adhesive material 502 is applied as a continuous layer covering the whole top surface of the support component 500, but the disclosure is not limited thereto. In alternative embodiments, the adhesive material 502 may include a plurality of discrete sections distributed on the top of the support component 500, as long as the amount of the adhesive material 502 is enough for the attachment of the lid (FIG. 6E) to the support component 500.

Figure 6E:
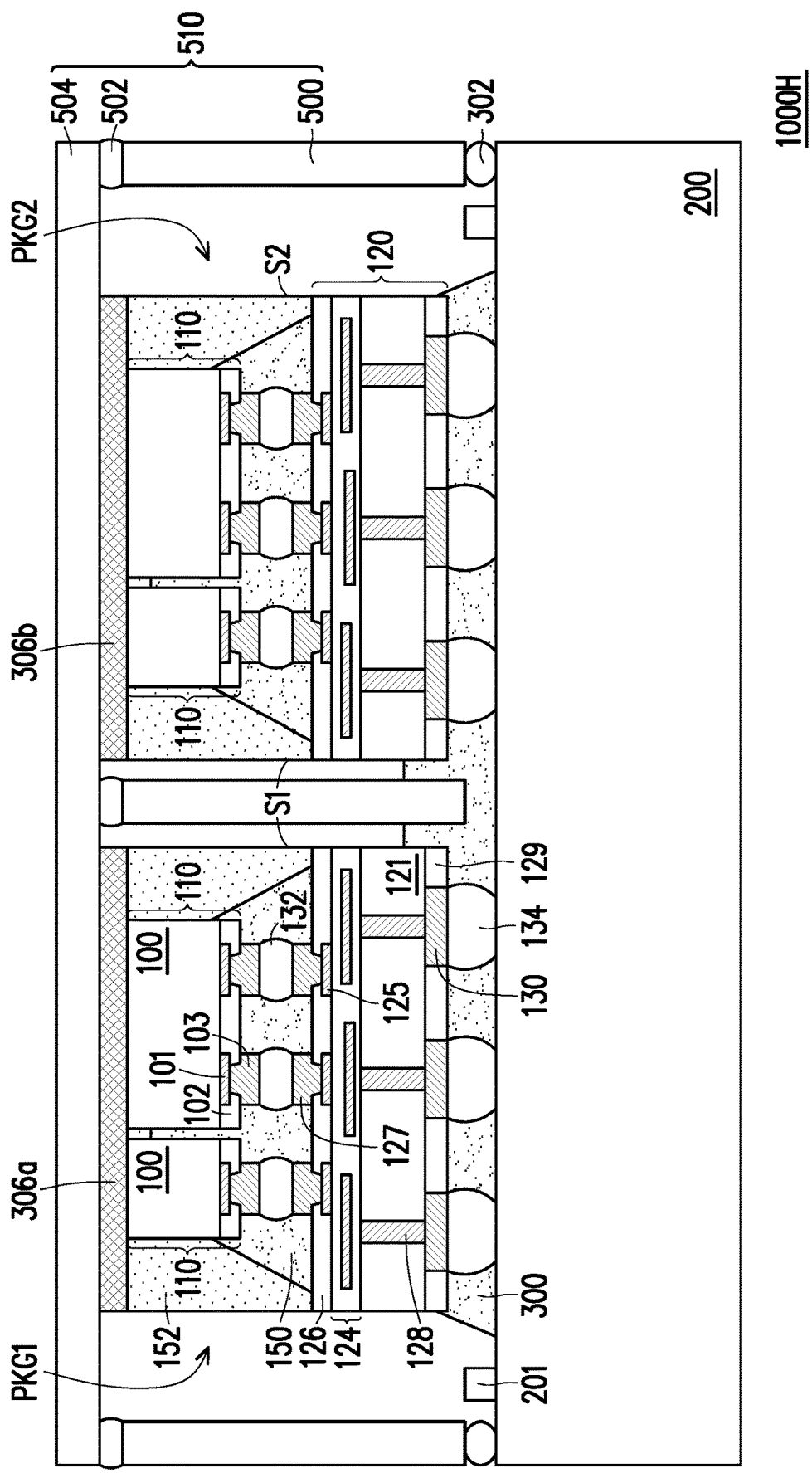

Referring to FIG. 6E, a lid 504 is disposed on the support component 500 and the semiconductor packages PKG1 and PKG2. In some embodiments, the lid 504 is attached to the support component 500 through the adhesive material 502, and attached to the semiconductor packages PKG1/PKG2 through the thermal conductive layers 306a/306b. The attachment of the lid 504 may include placing the lid 504 onto the adhesive material 502 and the thermal conductive layers 306a/306b, thereafter, a curing process is performed to cure the adhesive material 502. In some embodiments, the adhesive material 302 and the underfill layer 300 may also be cured during the curing process. In alternative embodiments, the adhesive material 302 and the underfill layer 300 may be cured by another curing process before forming the adhesive material 502 and the thermal conductive layers 306a/306b.

In some embodiments, during the attachment of the lid 504, the lid 504 presses the adhesive material 502 toward the support component 500, such that the adhesive materials spread out between the lid 504 and the support component 500. In some embodiments, the adhesive material 502 may be pushed laterally extending beyond sidewalls of the support component 500. In some embodiments, the adhesive material 502 may further extend to cover a portion of sidewalls of the support component 500. However, the disclosure is not limited thereto.

In some embodiments, the support component 500 and the lid 504 and the adhesive material 502 therebetween constitute a heat dissipation structure 510. The support component 500 may also be referred to as a support portion of the heat dissipation structure 510, and the lid 504 may also be referred to as a lid portion of the heat dissipation structure 510. In the present embodiments, the additional part 500b of the support component 500 is disposed in the gap between the semiconductor packages PKG1 and PKG2 and may also be referred to as a gap filling structure.

As such, a package structure 1000H is thus formed. In some embodiment, the package structure 1000H includes the package substrate 200, the semiconductor packages PKG1 and PKG2, the underfill layer 300, the thermal conductive layers 306a and 306b, and the heat dissipation structure 510. In some embodiments, the additional part 500b of the heat dissipation structure 510 serves as the gap filling structure partially disposed in the gap G between the semiconductor packages PKG1 and PKG2. The additional part 500b may be laterally spaced apart from sidewalls S1 of the semiconductor packages PKG1 and PKG2. In some embodiment, the additional part 500b is attached to the package substrate 200 through the underfill layer 300.

In the embodiments of the disclosure, multiple semiconductor packages are disposed on the package substrate and spaced apart from each other. Compared to a single large semiconductor package disposed on the package substrate, the multiple semiconductor packages may help to reduce the stress applied to the package substrate. In additional, gap filling structure is formed in the gap between the semiconductor packages. In some embodiments, the semiconductor packages are physically connected to each other by the semiconductor packages. In alternative embodiments, the heat dissipation structure is formed to have an additional part disposed in the gap between the semiconductor packages. As such, the warpages of the semiconductor packaged are reduced, and the delamination between the thermal conductive layer and the semiconductor packages are reduced or avoided. As a result, the thermal dissipation performance of the package structure is improved.

In accordance with some embodiments of the disclosure, a package structure includes a package substrate, a first semiconductor package and a second semiconductor package, an underfill material, a gap filling structure and a heat dissipation structure. The first semiconductor package and the second semiconductor package are electrically bonded to the package substrate. The underfill material is disposed to fill a first space between the first semiconductor package and the package substrate and a second space between the second semiconductor package and the package substrate. The gap filling structure is disposed over the package substrate and in a first gap laterally between the first semiconductor package and the second semiconductor package. The heat dissipation structure is disposed on the package substrate and attached to the first semiconductor package and the second semiconductor package through a thermal conductive layer.

In accordance with alternative embodiments of the disclosure, a package structure includes a package substrate, a plurality of semiconductor packages, a gap filling structure and an underfill layer. The semiconductor packages are disposed on the package substrate and laterally spaced apart from each other. At least one of the plurality of semiconductor packages includes a die electrically bonded to an interposer that is disposed between the die and the package substrate; and an encapsulant disposed on the interposer to encapsulate the die. The gap filling structure is disposed to fill a gap between the plurality of semiconductor packages. The semiconductor packages are physically connected to each other through the gap filling structure. The underfill material is disposed to fill spaces between the semiconductor packages and the package substrate.

In accordance with some embodiments of the disclosure, a method of forming a package structure includes: electrically bonding a first semiconductor package and a second semiconductor package to a package substrate; forming an underfill material to fill a first space between the first semiconductor package and the package substrate and a second space between the second semiconductor package and the package substrate; disposing a gap filling structure in a gap between the first semiconductor package and the second semiconductor package; forming a thermal conductive layer on the first semiconductor package and the second semiconductor package; and disposing a heat dissipation structure on the substrate and the first and second semiconductor packages, wherein the heat dissipation structure is attached to the first and second semiconductor packages through the thermal conductive layer.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A package structure, comprising:
a package substrate;
a first semiconductor package and a second semiconductor package, electrically bonded to the package substrate;
an underfill material, disposed to fill a first space between the first semiconductor package and the package substrate and a second space between the second semiconductor package and the package substrate;
a gap filling structure, disposed over the package substrate and in a first gap laterally between the first semiconductor package and the second semiconductor package, wherein the underfill material is a continuous layer extending from the first space, across the first gap and extending to the second space, and the gap filling structure lands on a portion of the underfill material in the first gap between the first semiconductor package and the second semiconductor package; and
a heat dissipation structure, disposed on the package substrate and attached to the first semiconductor package and the second semiconductor package through a thermal conductive layer.

2. The package structure of claim 1, wherein the gap filling structure is in contact with sidewalls of the first semiconductor package and the second semiconductor package.

3. The package structure of claim 1, wherein the first semiconductor package comprises:
a die electrically bonded to an interposer that is disposed between the die and the package substrate; and
an encapsulant, disposed on the interposer to encapsulate the die.

4. The package structure of claim 3, wherein the die and the encapsulant are in contact with the thermal conductive layer.

5. The package structure of claim 1, wherein a top surface of the gap filling structure is lower than top surfaces of the first semiconductor package and the second semiconductor package, and overlaid by the thermal conductive layer, and a second gap is existed between the top surface of the gap filling structure and the thermal conductive layer.

6. The package structure of claim 1, wherein a modulus of the gap filling structure is less than a modulus of the underfill material.

7. The package structure of claim 1, wherein the thermal conductive layer is a continuous film extending over the first semiconductor package, the second semiconductor package, and the gap filling structure.

8. The package structure of claim 1, wherein
the heat dissipation structure comprises:
a support component disposed on the package substrate and laterally surrounds the first semiconductor package and the second semiconductor package; and a lid, disposed on the support component and thermal conductive layer.

9. The package structure of claim 8, wherein the support component is attached to the package substrate through an adhesive material.

10. A package structure, comprising:
a package substrate;
a plurality of semiconductor packages, disposed on the package substrate and laterally spaced apart from each other, at least one of the plurality of semiconductor packages comprises:
a die electrically bonded to an interposer that is disposed between the die and the package substrate; and
an encapsulant, disposed on the interposer to encapsulate the die;
a gap filling structure, disposed to fill a gap between the plurality of semiconductor packages, wherein the semiconductor packages are physically connected to each other through the gap filling structure; and
an underfill material, disposed to fill spaces between the semiconductor packages and the package substrate, wherein the gap filling structure is separated from the package substrate by a portion of the underfill material therebetween.

11. The package structure of claim 10, wherein a modulus of the gap filling structure is less than a modulus of the encapsulant or a modulus of the underfill material.

12. The package structure of claim 10, further comprising:
a thermal conductive layer, disposed on top surfaces of the semiconductor packages; and
a heat dissipation structure, disposed on the package substrate and attached to the semiconductor packages through the thermal conductive layer.

13. The package structure of claim 12, wherein a contact area between the gap filling structure and the thermal conductive layer is less than an area of a top surface of the gap filling structure.

14. The package structure of claim 12, wherein the thermal conductive layer is a continuous film extending over the plurality of semiconductor packages and the gap filling structure.

15. The package structure of claim 10, wherein a top surface of the gap filling structure is lower than top surfaces of the plurality of semiconductor packages.

16. The package structure of claim 10, wherein the gap filling structure is in physical contact with sidewalls of the plurality of semiconductor packages.

17. A method of forming a package structure, comprising:
electrically bonding a first semiconductor package and a second semiconductor package to a package substrate;
forming an underfill material to fill a first space between the first semiconductor package and the package substrate and a second space between the second semiconductor package and the package substrate, wherein the underfill material is a continuous layer extending from the first space, across the first gap and extending to the second space;
disposing a gap filling structure in a gap between the first semiconductor package and the second semiconductor package, wherein the gap filling structure lands on a portion of the underfill material in the first gap between the first semiconductor package and the second semiconductor package;
forming a thermal conductive layer on the first semiconductor package and the second semiconductor package; and
disposing a heat dissipation structure on the package substrate and the first and second semiconductor packages, wherein the heat dissipation structure is attached to the first and second semiconductor packages through the thermal conductive layer.

18. The method of claim 17, wherein the gap filling structure is formed to fill the gap before forming the thermal conductive layer, and the thermal conducive layer is formed to overlay the gap filling structure.

19. The method of claim 17, wherein
forming the thermal conductive layer as a continuous film extending over the first semiconductor package, the second semiconductor package, and the gap filling structure.

20. The method of claim 17, wherein disposing the heat dissipation structure comprises:
attaching a support component to the package substrate before forming the underfill material, wherein the support component surrounds the first and second semiconductor packages; and
attaching a lid to the support component by an adhesive material and to the first and second semiconductor packages through the thermal conductive layer.

* * * * *